(12) United States Patent
Remla et al.

(10) Patent No.: US 11,314,277 B1
(45) Date of Patent: Apr. 26, 2022

(54) SERIAL LANE-TO-LANE SKEW REDUCTION

(71) Applicant: XILINX, INC., San Jose, CA (US)

(72) Inventors: Riyas Noorudeen Remla, Singapore (SG); Gourav Modi, Singapore (SG); Azarudin Abdulla, Singapore (SG); Chee Chong Chan, Singapore (SG)

(73) Assignee: XILINX, INC., San Jose, CA (US)

( * ) Notice: Subject to any disclaimer, the term of this patent is extended or adjusted under 35 U.S.C. 154(b) by 332 days.

(21) Appl. No.: 16/532,293

(22) Filed: Aug. 5, 2019

(51) Int. Cl.
| | |
|---|---|
| *G06F 1/00* | (2006.01) |
| *G06F 1/10* | (2006.01) |
| *G06F 13/42* | (2006.01) |
| *G06F 9/54* | (2006.01) |
| *G06F 9/30* | (2018.01) |
| *G06F 30/34* | (2020.01) |

(52) U.S. Cl.
CPC ............ *G06F 1/10* (2013.01); *G06F 9/30134* (2013.01); *G06F 9/544* (2013.01); *G06F 13/4291* (2013.01); *G06F 30/34* (2020.01)

(58) Field of Classification Search
CPC ........ G06F 1/10; G06F 30/34; G06F 9/30134; G06F 13/4291; G06F 9/544
See application file for complete search history.

(56) References Cited

U.S. PATENT DOCUMENTS

| | | | |
|---|---|---|---|
| 8,411,703 B1 | 4/2013 | Cory | |
| 8,937,491 B2 | 1/2015 | Gaide et al. | |
| 2008/0270818 A1* | 10/2008 | Joordens | G06F 1/10 713/500 |
| 2011/0102043 A1* | 5/2011 | Zerbe | H03H 11/265 327/261 |
| 2015/0326385 A1* | 11/2015 | Hashida | H04L 7/033 375/359 |
| 2017/0195111 A1* | 7/2017 | Takahashi | H04L 7/0041 |
| 2019/0121758 A1* | 4/2019 | Lawson | G06F 1/10 |
| 2019/0180041 A1* | 6/2019 | Bhunia | G06F 13/28 |
| 2020/0301466 A1* | 9/2020 | Kashiwagi | G06F 1/08 |

* cited by examiner

*Primary Examiner* — Xuxing Chen
(74) *Attorney, Agent, or Firm* — Patterson + Sheridan, LLP

(57) ABSTRACT

Examples described herein provide a method for reducing lane-to-lane serial skew in an integrated circuit. In an example using a processor-based system, a maximum clock skew is determined from clock skews of respective lanes of a transmitter of the IC. Each of the clock skews corresponds to a skew of a clock signal of the respective lane relative to a same reference clock signal. A skew match amount is determined for each lane of the lanes of the transmitter. The skew match amount for a respective lane of the lanes is based on the maximum clock skew and the clock skew of the respective lane. Configuration data is generated to configure the transmitter to shift incoming data for each lane of the lanes based on the skew match amount for the respective lane.

20 Claims, 14 Drawing Sheets ized above, may be had by reference to example

SERIAL LANE-TO-LANE SKEW REDUCTION

TECHNICAL FIELD

Examples of the present disclosure generally relate to multi-lane communications and, in particular, to lane-to-lane serial data skew reduction in such communications.

BACKGROUND

Digital systems commonly use clock signals in order to synchronize data. However, data passing through transmitters of digital systems often become desynchronized because of transmission serial lane skews, resulting from skew of clock signals across all the lanes. Most applications and processes on an integrated circuit (IC) may share a clock signal driven from one lane. However, routing of clock signals can add skew. The interface used by the transmitter or transceiver can also add to the clock signal skew. Accordingly, clock signal skew can increase for increasing lanes.

SUMMARY

Examples described herein provide for reducing serial lane-to-lane clock skew in a programmable integrated circuit (IC). An example is a method using a processor-based system. A maximum clock skew is determined from clock skews of respective lanes of a transmitter of the programmable IC. Each of the clock skews corresponds to a skew of a clock signal of the respective lane relative to a same reference clock signal. A skew match amount is determined for each lane of the lanes of the transmitter. The skew match amount for a respective lane of the lanes is based on the maximum clock skew and the clock skew of the respective lane. Configuration data is generated to configure the transmitter to shift incoming data for each lane of the lanes based on the skew match amount for the respective lane.

Another example is a programmable integrated circuit (IC). The programmable IC comprises a transmitter with transmission lanes, and each of the transmission lanes has a clock skew relative to a same reference clock signal. Each of the transmission lanes comprises programmable shift logic configurable to shift a signal based on a skew match amount. The skew match amount for a respective transmission lane is based on the clock skew of the respective transmission lane and a maximum clock skew of the clock skews of the transmission lanes.

Another example is a non-transitory computer-readable medium embodying computer program instructions for lane-to-lane skew reduction. The computer program instructions is configured to implement a method. A maximum clock skew is determined from clock skews of respective lanes of a transmitter of the programmable IC. Each of the clock skews corresponds to a skew of a clock signal of the respective lane relative to a same reference clock signal. A skew match amount is determined for each lane of the lanes of the transmitter. The skew match amount for a respective lane of the lanes is based on the maximum clock skew and the clock skew of the respective lane. Configuration data is generated to configure the transmitter to shift incoming data for each lane of the lanes based on the skew match amount for the respective lane.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
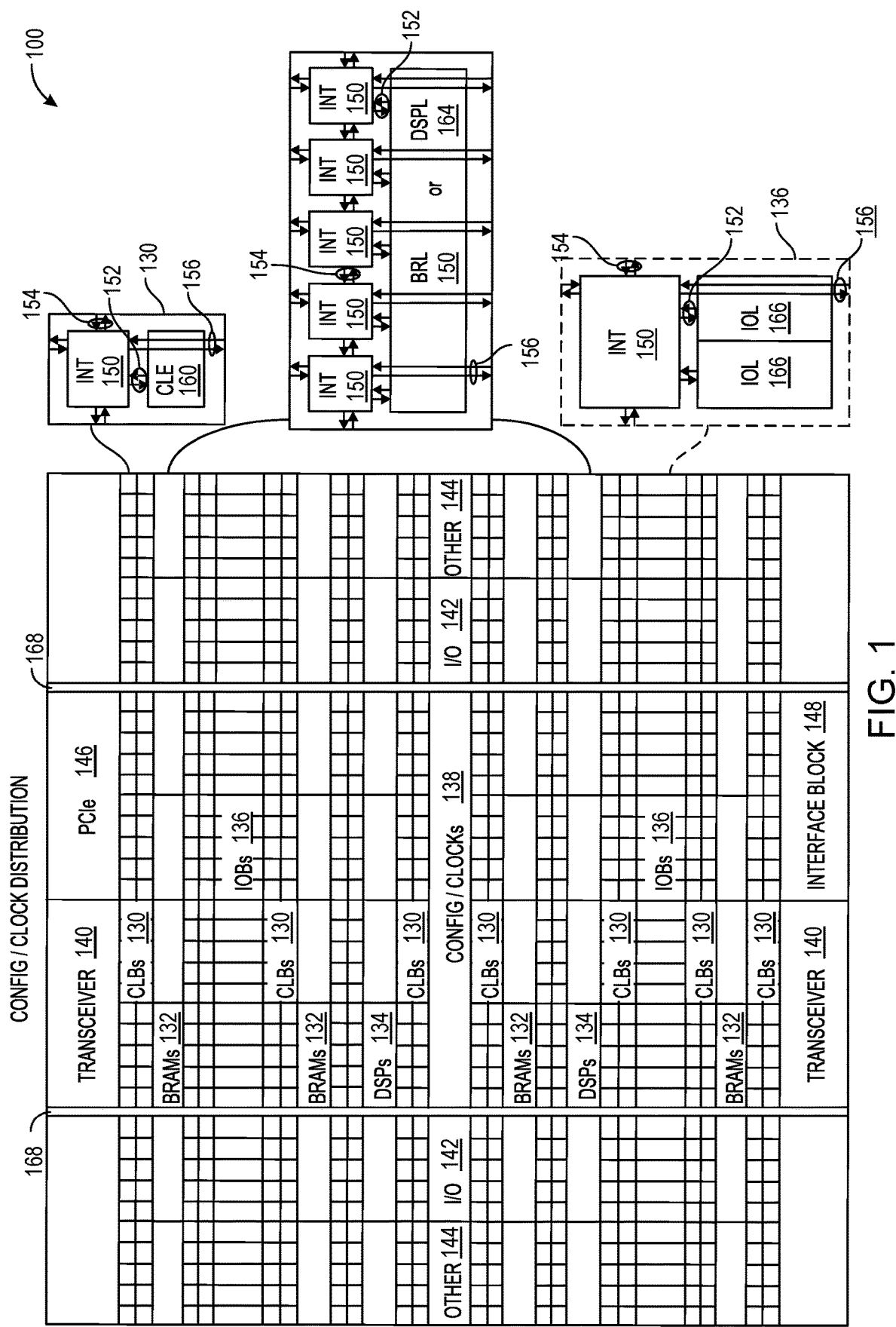
FIG. 1 illustrates a field programmable gate array (FPGA) of a programmable integrated circuit (IC) that may implement lane-to-lane skew reduction techniques according to some examples.

Various features are described hereinafter with reference to the figures. It should be noted that the figures may or may not be drawn to scale and that the elements of similar structures or functions are presented by like reference numerals through the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other example even if not so illustrated or if not so explicitly described.

Examples described herein relate to lane-to-lane skew reduction techniques for integrated circuits (IC). The lane-to-lane skew reduction techniques disclosed herein can reduce the lane-to-lane serial skew of a transmitter of a programmable IC by matching the clock skews between the lanes of the transmitter and/or by aligning the data passing through the lanes of the transmitter. As herein described, the lane-to-lane skew reduction techniques may be based on timing-driven information to reduce serial lane-to-lane skew. The lane-to-lane skew reduction techniques can involve measuring clock skews across lanes of a transmitter based on a reference lane, and determine which one of the clock skews is the maximum clock skew. The differences between the respective clock skews and the maximum clock skew may then be calculated to obtain the skew match amount for the each of the lanes to match the maximum clock skew. Using the skew match amount for each lane, the serial skew can be adjusted by increasing the amount of skew of each lane relative to the reference lane to match the maximum clock skew and/or by shifting the data coming through the lane by the skew match amount, which accordingly reduces the lane-to-lane skew.

The lane-to-lane skew reduction techniques disclosed herein can be used with multi-lane protocols, which can have tight serial lane-to-lane skew requirements. Protocols, such as cache coherent interconnect for accelerators (CCIX), peripheral component interconnect express (PCIe), and 100G/400G Ethernet, use multiple serial lanes and have tight serial lane-to-lane skew requirements. The skew reduction techniques can reduce the transmission serial lane-to-lane skew, thereby allowing use of multi-lane protocols.

FIG. 1 illustrates a field programmable gate array (FPGA) of a programmable integrated circuit (IC) 100 that may implement lane-to-lane skew reduction techniques, such as described herein, according to some examples. The programmable IC 100 is implemented on a semiconductor substrate, such as typically included in a die or chip.

The programmable IC 100 includes a large number of different programmable tiles including configurable logic blocks ("CLBs") 130, random access memory blocks ("BRAMs") 132, signal processing blocks ("DSPs") 134, input/output blocks ("IOBs") 136, configuration and clocking logic ("CONFIG/CLOCKS") 138, transceivers 140, specialized input/output blocks ("I/O") 142 (e.g., configuration ports and clock ports), and other programmable logic 144 such as digital clock managers, system monitoring logic, and so forth. The FPGA can also include PCIe interfaces 146, other interface blocks 148, and the like.

In some FPGAs, each programmable tile can include at least one programmable interconnect element ("INT") 150 having connections to input and output terminals 152 of a programmable logic element within the same tile, as shown by examples included in FIG. 1. Each programmable interconnect element 150 can also include connections to interconnect segments 154 of adjacent programmable interconnect element(s) in the same tile or other tile(s). Each programmable interconnect element 150 can also include connections to interconnect segments 156 of general routing resources between logic blocks (not shown). The general routing resources can include routing channels between logic blocks (not shown) comprising tracks of interconnect segments (e.g., interconnect segments 156) and switch blocks (not shown) for connecting interconnect segments. The interconnect segments of the general routing resources (e.g., interconnect segments 156) can span one or more logic blocks. The programmable interconnect elements 150 taken together with the general routing resources implement a programmable interconnect structure ("programmable interconnect") for the illustrated FPGA.

In an example implementation, a CLB 130 can include a configurable logic element ("CLE") 160 that can be programmed to implement user logic plus a single programmable interconnect element ("INT") 150. A BRAM 132 can include a BRAM logic element ("BRL") 162 in addition to one or more programmable interconnect elements. Typically, the number of interconnect elements included in a tile depends on the height of the tile. In the pictured example, a BRAM tile has the same height as five CLBs, but other numbers (e.g., four) can also be used. A signal processing block 134 can include a DSP logic element ("DSPL") 164 in addition to an appropriate number of programmable interconnect elements. An IOB 136 can include, for example, two instances of an input/output logic element ("IOL") 166 in addition to one instance of the programmable interconnect element 150. As will be clear to those of skill in the art, the actual I/O pads connected, for example, to the input/output logic element 166 typically are not confined to the area of the input/output logic element 166.

In the pictured example, a horizontal area near the center of the die is used for configuration, clock, and other control logic. Vertical columns 168 extending from this horizontal area or column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic.

Note that FIG. 1 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 1 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

The various aspects of lane-to-lane skew reduction techniques can be implemented in any block of the programmable IC 100. Any combination of examples may be included in a single IC.

Figure 2:
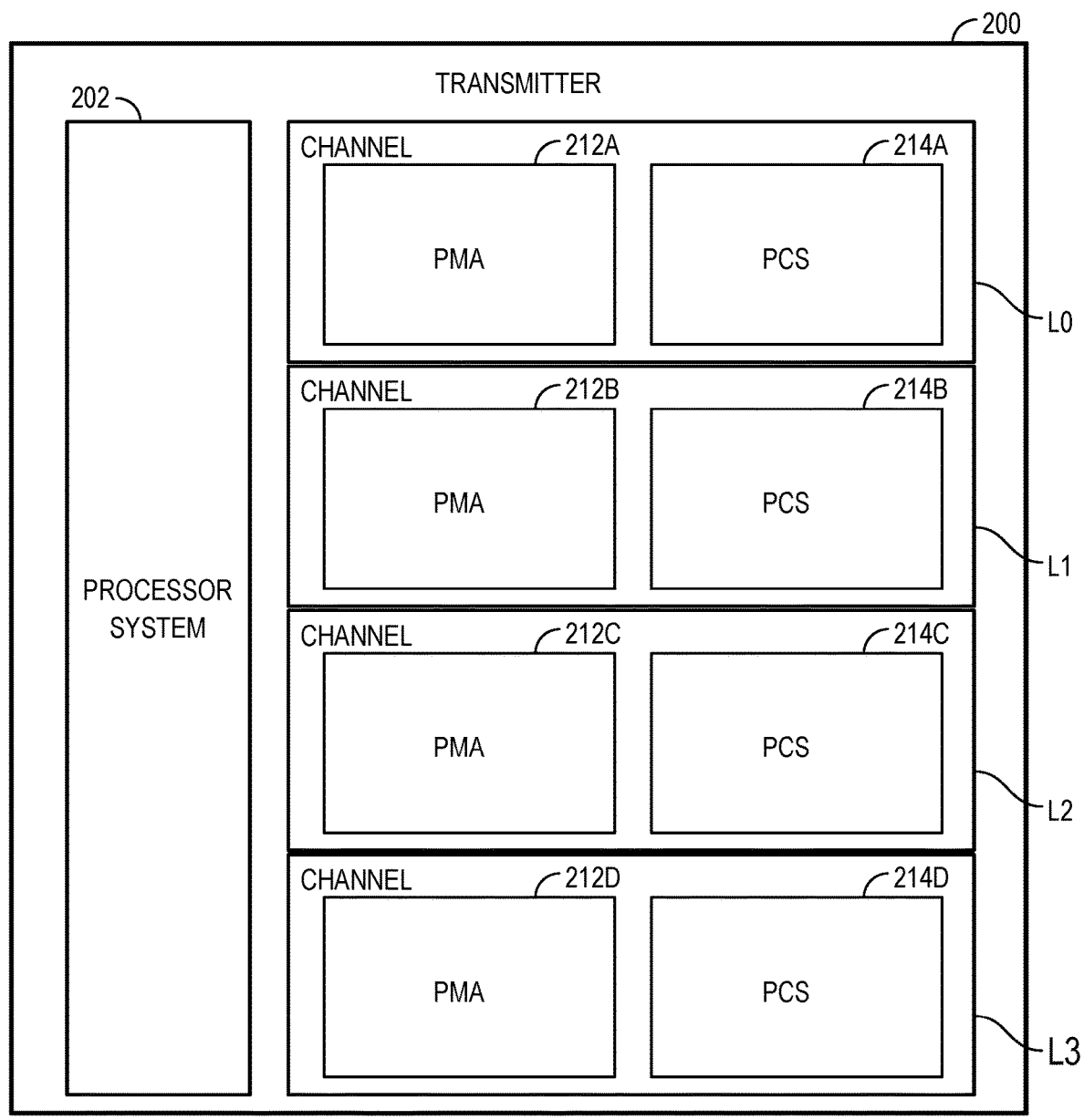
FIG. 2 illustrates a transmitter that uses a lane-to-lane skew reduction technique according to some examples.

FIG. 2 illustrates a transmitter that uses a lane-to-lane skew reduction technique according to some examples. The transmitter 200 shown in FIG. 2 can be or include a transceiver 140 (e.g., a multi-gigabit transceiver) or other interface block 148 of FIG. 1.

The transmitter 200 comprises lanes (or also referred to as channels) for data transmission. Four lanes L0-L3 are illustrated as an example; more or fewer lanes can be implemented. Each lane L0-L3 comprises a physical medium attachment (PMA) 212 and a Physical Coding Sub-Layer (PCS) 214. The PMA 212 comprises a serializer (illustrated in FIG. 5). In some examples, the PMA 212 converts data from parallel to serial or serial to parallel. The PCS 214 is configured to implement processing logic between the PMA 212 and the rest of the programmable IC. The transmitter 200 can use multi-lane protocols, such as CCIX, PCIe, and 100G/400G Ethernet. The transmitter 200 can include additional components (e.g., processor system 202) for transmitting data. The transmitter 200 can implement any number of lanes having PMA 212 and PCS 214.

Figure 3:
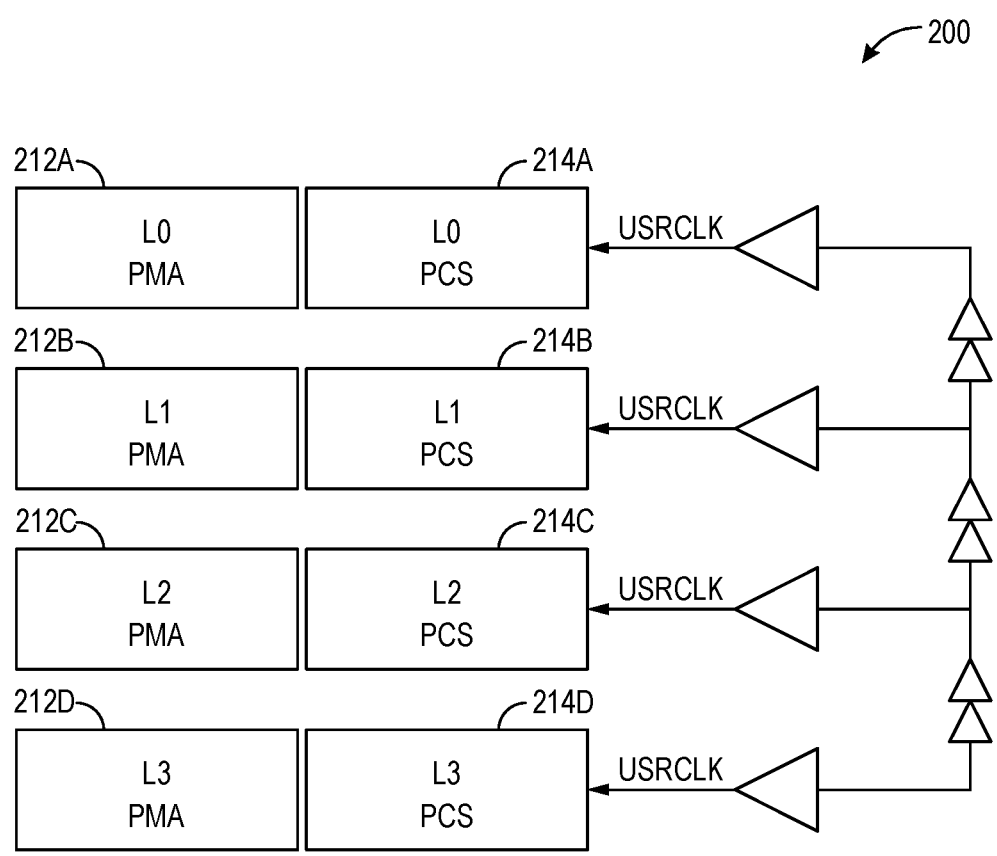
FIG. 3 illustrates transmitter with lanes to receive a clock signal and the application of a lane-to-lane skew reduction technique according to some examples.

FIG. 3 illustrates a transmitter with lanes to receive a clock signal and the application of a lane-to-lane skew reduction technique according to some examples. The transmitter 200 receives a clock signal (USRCLK) and distributes the clock signal to each of its lanes. Because of the natural characteristics of a transmitter 200, the clock signal may travel different distances before the respective PCS 214 of the lanes L0-L3 receive the clock signal. The different distances can result in different time delays (e.g., due to differing resistance-capacitance time constants) between the clock signal received at the lanes. Accordingly, the clock signal as received by each PCS 214 can be skewed from the PCS 214 in other lanes. For example, the PCS 214 for lane L3 can receive the clock signal before the respective PCS 214 for lanes L0, L1, and L2 because the clock signal travels further through the transmission medium of the transmitter 200 to reach lanes L0, L1, and L2. In an example, multi-gigabit transceivers (MGTs) with dedicated interface block for the PHY Interface for the PCI Express Architecture (PIPE) can increase the clock skew. In some examples, the clock signal skew can be 1.2 ns between 16 lanes of a multi-gigabit transceiver.

Certain examples described herein apply to components of each lane of the transmitter, and reference to a component of the lane may be made herein generally and can apply to the corresponding component of any lane of the transmitter. For example, reference may be made herein generally to a PCS 214, which can apply to any one or more of PCS 214a, 214b, 214c, 214d. Similarly, reference may be made herein generally to a PMA 212, which can apply to any one or more of PMA 212a, 212b, 212c, 212d.

Figure 4:
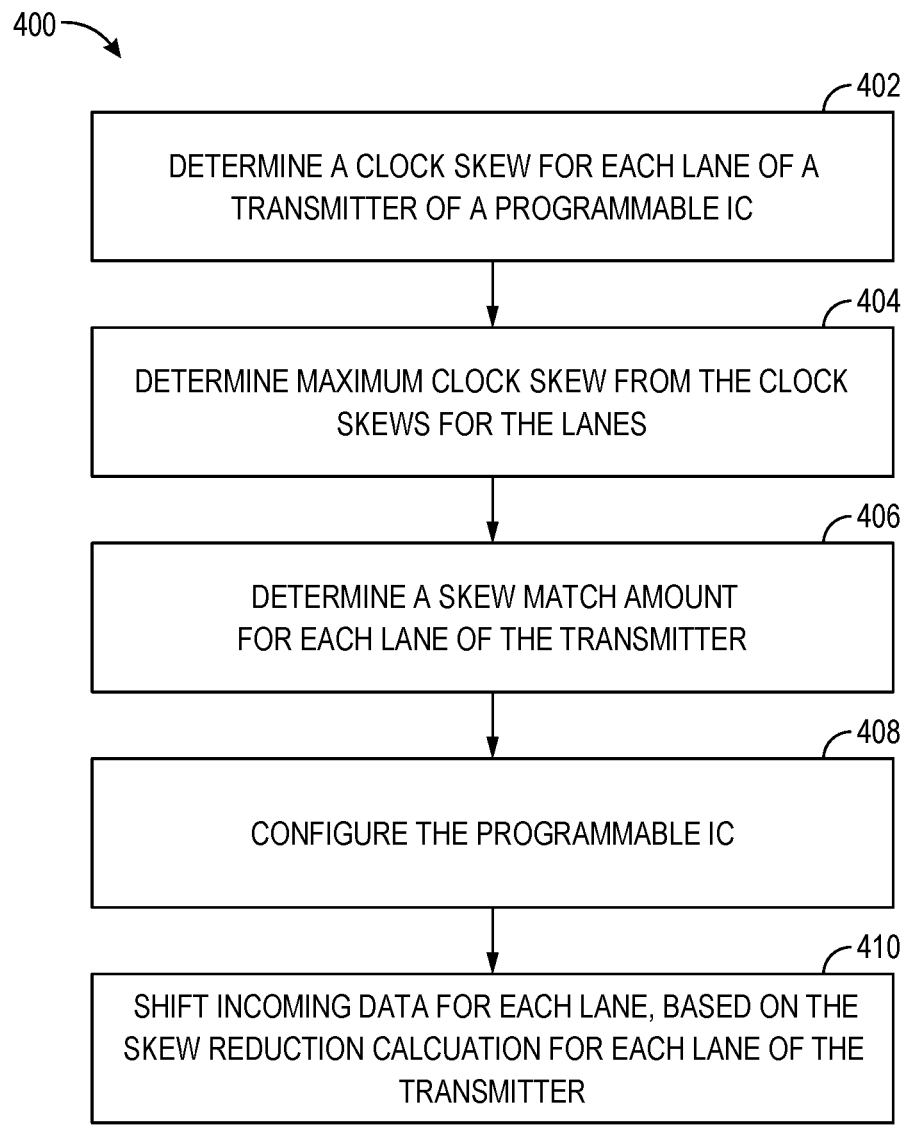
FIG. 4 is a flow chart of a lane-to-lane skew reduction technique according to some examples.

FIG. 4 is a flow chart of a lane-to-lane skew reduction technique according to some examples. The flow chart comprises operations 400 to reduce lane-to-lane clock skew in a transmitter 200 of a programmable IC (such as the programmable IC 100). In some examples, the lane-to-lane skew reduction technique applies to transmitters running in FIFO bypass mode and using high bandwidth memory (HBM) protocols.

Operations 400 begin, at block 402, with determining a clock skew for each lane of the transmitter 200 of the programmable IC. The clock skew for each lane can be determined during implementation of a user design to be instantiated on the programmable IC by a design application. The clock skew for each lane of the transmitter 200 is measured from a reference lane, which can be the lane which receives the clock signal before the other lanes. For example, the reference lane is lane L3 of FIG. 3 because lane L3 receives the clock signal before the other lanes L0-L2, and clock skew for each lane of transmitter 200 is measured relative to the reference lane L3. Accordingly, the skew for lane L3 from lane L3 is zero. As an example for illustrative purposes, the skew for lane L2 from lane L3 is 300 ps; the skew for lane L1 from lane L3 is 600 ps; and the skew for lane L0 from lane L3 is 900 ps. The amount of clock skew for each lane of the transmitter 200 can differ based on the distance from the reference lane. In some examples, the measured clock skew is the lane-to-lane clock skew as each lane's clock skew is measured from a reference lane (e.g., lane L3). In some examples, the measured clock skew is the lane's clock skew relative to the clock signal source.

In some examples, the clock skew for each lane of the transmitter 200 from the reference lane can be determined based on the propagation time of the clock signal from the reference lane to the respective lane. In some examples, the lanes of the transmitter 200 are uniformly distributed, so that the clock skew for each lane from the reference lane can be determined based on the propagation time of the clock signal from the reference lane to the first lane multiplied by the number of lanes less the reference lane.

In some examples, the clock signal from one of the lanes is shared with the other lanes of the transmitter. For example, lane L3 (or another component) produces a clock signal (OUTCLK) and transmits the clock signal to the other lanes of the transmitter (e.g., lanes L0-L2). By sharing the clock signal from one lane of the transmitter with the other lanes of the transmitter, the transmitter can ensure that the clock signals used across the lanes L0-L3 are substantially synchronized.

In some examples, the clock skew is converted for each lane of the transmitter 200 to a digital time unit (e.g., unit interval (UI)) for skew adjustment. For example, every 62.5 ps of skew converts into 1 UI of skew. In some examples, one UI represents the time spent to send one bit of data. Accordingly, using the example above, the clock skew for lane L2 from lane L3 is about 5 UI; the clock skew for lane L1 from lane L3 is about 10 UI; and the clock skew for lane L0 from lane L3 is about 15 UI. By converting from seconds as the unit of time to UI as the unit of time, the converted clock skews can apply to multiplexers in the logic of the transmitter 200. The conversion from seconds to UI can vary based on the programmable IC.

At block 404, the maximum clock skew is determined from the clock skews of the lanes of the transmitter 200. One of the clock skews determined at block 402 for the lanes of the transmitter 200 is the largest clock skew, and thus, is the maximum clock skew of the transmitter 200. Using the example discussed with regards to block 402, the maximum clock skew is 900 ps corresponding to lane L0. The maximum clock skew can be determined using the converted clock skew (e.g., 15 UI).

At block 406, a skew match amount is determined for each lane of the transmitter 200 based on the maximum clock skew. The skew match amount is the amount of additional skew for a lane to approximately match the maximum clock skew. In some examples, for each lane and its corresponding clock skew, the difference of the lane's corresponding clock skew from the maximum clock skew is calculated to obtain the skew match amount for the lane.

Because the clock skew of each lane may be different, the skew match amount for each lane of the transmitter 200 may be different from the others. For example, using the clock skews discussed with regards to blocks 402 and 404, the skew match amounts take into account the maximum clock skew of lane L0 (900 ps) and the clock skews for the lanes of the transmitter 200. Accordingly, lane L3's clock skew is 0, and the corresponding skew match amount is 900 ps; lane L2's clock skew is 300 ps, and the corresponding skew match amount is 600 ps; lane L1's clock skew is 600 ps, and the corresponding skew match amount is 300 ps; and lane L0's clock skew is 900 ps, and the corresponding skew match amount for lane L0 is 0 ps. Each lane's measured clock skew and its skew match amount totals to the maximum clock skew.

Because clock skews can be converted to UI, the skew match amount can also be determined in UIs. Accordingly, using the skew match amounts from the example, lane L3's skew match amount is 15 UI; lane L2's skew match amount is 10 UI, and lane Lis skew match amount is 5 UI.

At block 408, the programmable IC is configured. In some examples, the skew match amounts are included in configuration data (e.g., a bitstream) that is loaded onto and configures the programmable IC. Configuration data can be written to configuration registers of the transmitter 200 to configure the lanes of the transmitter 200 to implement the determined skew match amount for each lane.

At block 410, the programmable IC begins processing incoming data to be transmitted from the transmitter 200, and the incoming data is shifted in each lane based on the skew match amount for the respective lane of the transmitter 200. As mentioned, the skew match amount for each lane of the transmitter 200 can be customized based on the lane, so that the clock skew of each lane is adjusted to match the maximum clock skew of the transmitter 200. Accordingly, the incoming data is shifted for each lane based on the lane's corresponding skew match amount determined at block 406.

Figure 5:
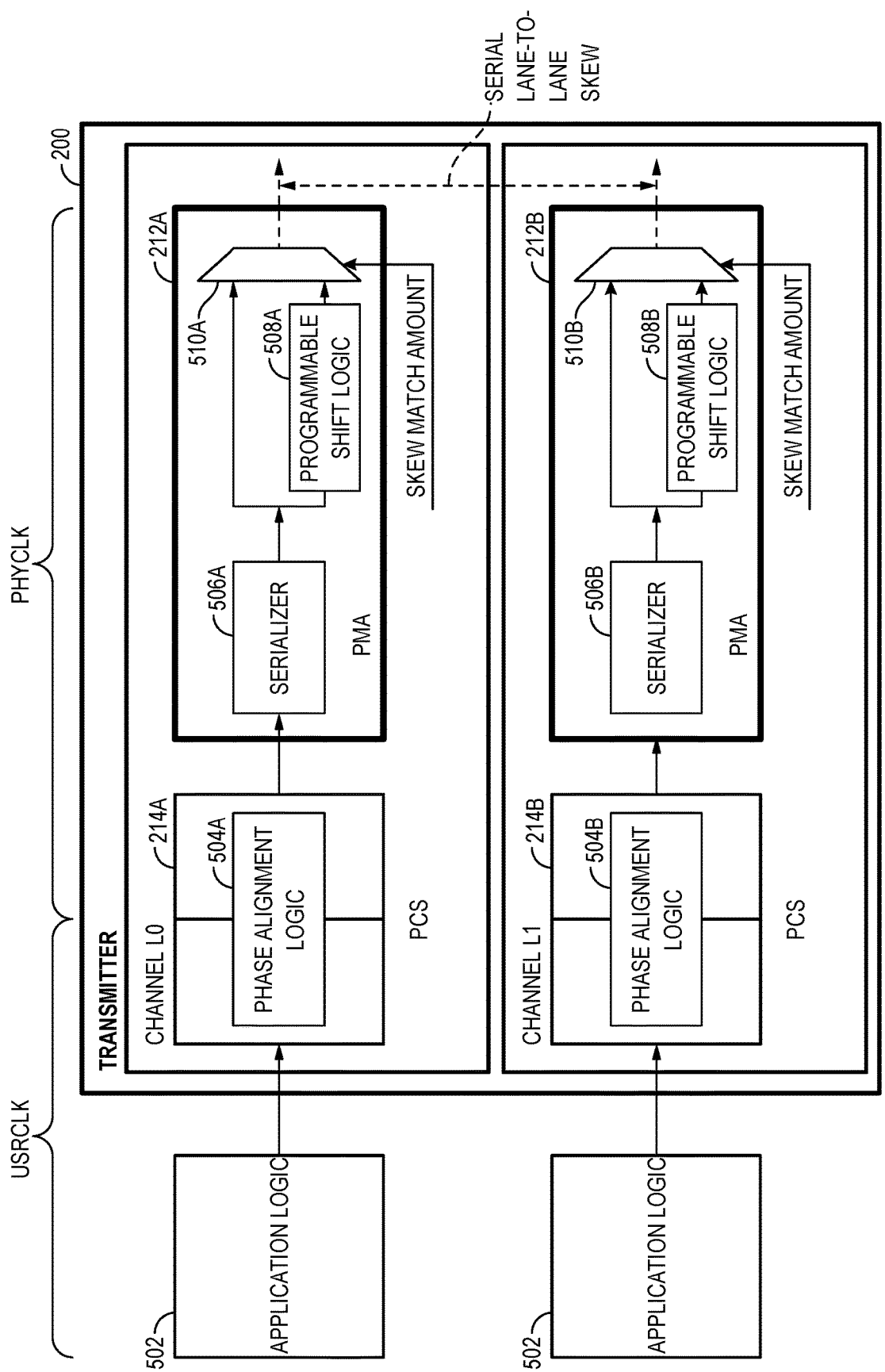
FIG. 5 illustrates an example of a PMA-based lane-to-lane skew reduction technique according to some examples.

FIG. 5 illustrates an example PMA-based lane-to-lane skew reduction technique, according to some examples. The example PMA-based lane-to-lane skew reduction technique can reduce lane-to-lane skew by delaying incoming serial data by the lane's respective skew match amount. In some examples, each lane of the transmitter 200 includes the programmable shift logic 508 and a multiplexer 510, which is configured with the skew match amount of its corresponding lane. In some examples, the multiplexer 510 includes a bypass path (e.g., path 0 of the multiplexer) of the lane-to-lane skew reduction technique. For example, when the lane-to-lane skew reduction technique is used, the multiplexer 510 can use the programmable shift logic 508 for reducing lane-to-lane clock skew. When the lane-to-lane reduction technique is not used, the multiplexer 510 can use the bypass path and not use the programmable shift logic 508. In some examples, path 0 of the multiplexer 510 is the bypass path because path 0 does not include any delays (e.g., flip-flops) before passing through the multiplexer 510.

The PCS 214 of each lane is communicatively connected to and receives incoming parallel data from respective application logic 502. The incoming data passes through the phase alignment logic 504 of the PCS 214 to phase align the data with a clock signal of the transmitter 200. The transmitter 200 can run in FIFO Bypass mode, and the FIFO in the PCS 214 can be replaced with the phase alignment logic 504. For example, the phase alignment logic 504 can be at neighboring boundaries between differing clock domains, such as a user clock domain (USRCLK) and a physical interface clock domain (PHYCLK), and the phase alignment logic 504 can phase align the received data to transition from the USRCLK to the PHYCLK. The incoming data passes to the serializer 506 of the PMA 212. The serializer 506 converts the incoming data from parallel data to serial data, and transmits the serial data to the programmable shift logic 508 and to the multiplexer 510.

In certain examples, each lane comprises the programmable shift logic 508 in its PMA 212. The programmable shift logic 508 and multiplexer 510 use the lane's skew match amount (in seconds or in UI) to shift and adjust the incoming serial data accordingly. For example, the multiplexer 510 is configured with the skew match amount for its lane (e.g., 15 UI) to selectively output data from the programmable shift logic 508 that is shifted by the amount according to the skew match amount (e.g., 15 UI). By shifting the incoming data by the lane's skew match amount, the lane-to-lane skew can be reduced because each lane's skew approximately matches the maximum clock skew of the transmitter 200.

Figure 6:
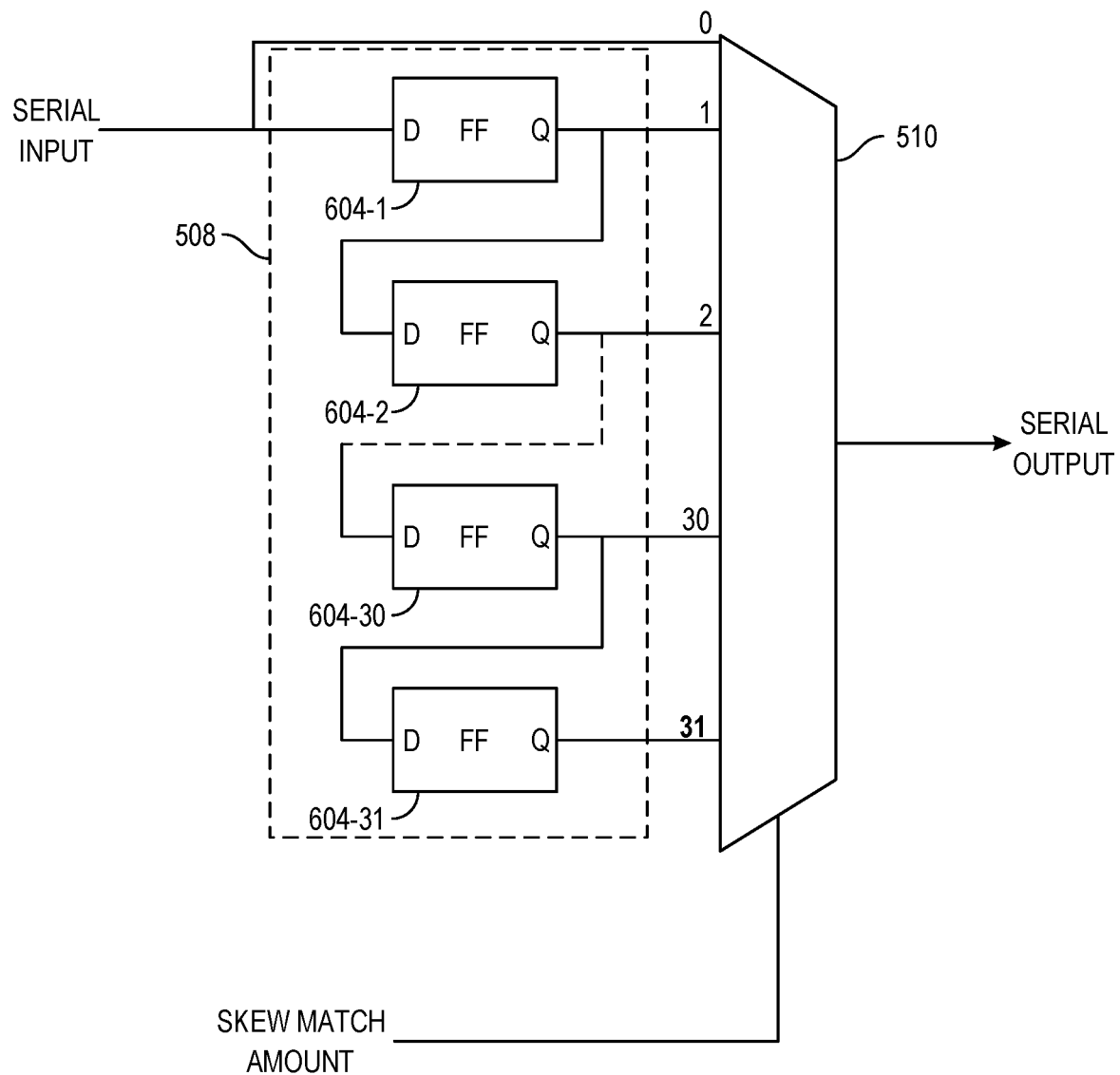
FIG. 6 illustrates programmable shift logic and a multiplexer of the example PMA-based lane-to-lane skew reduction techniques, according to some examples.

FIG. 6 illustrates programmable shift logic 508 and multiplexer 510 of the example PMA-based lane-to-lane skew reduction technique illustrated in FIG. 5, according to some examples. The multiplexer 510 of each lane can be controlled by configuration data stored in, e.g., a configuration register, and that corresponds with the skew match amount of the lane to reduce lane-to-lane skew of the transmitter 200.

The programmable shift logic 508 includes serially connected flip-flops 604-1 through 604-31 (referred to generally as flip-flops 604). The serially connected flip-flops 604 can form a serial shift register. An input node of the programmable shift logic 508 (on which serial data from the serializer 506 is input) is connected to an input node of the multiplexer 510 to bypass the programmable shift logic 508. The input node of the programmable shift logic 508 is further connected to an input node D of the flip-flop 604-1. As illustrated, within the serial shift register, an output node Q of each flip-flop 604 is connected to an input node D of the next flip-flop 604. The output node Q of each flip-flop 604 is further connected to respective input nodes of the multiplexer 510. Accordingly, the output signals of the flip-flops 604 are input signals to respective successive flip-flops. By chaining the flip-flops as illustrated in FIG. 6, the flip-flops 604 are configured to delay the serial data passing through the PMA 212.

The flip-flops 604 can be D flip-flops that transition a data state based on a clock, such as PHYCLK. In some examples, other components can be used to delay the serial data in place of and/or in addition to flip-flops 604. For example, buffers with a known delay can be used in the place of and/or in addition to flip-flops 604. The programmable shift logic 508 includes any number of flip-flops 604 or other components corresponding to the range of possible skew adjustments. In the illustrated example, 31 flip-flops 604 are implemented, and the multiplexer 510 has 32 input nodes corresponding to signals having various amounts of delay (e.g., 0 to 31 UI).

In some examples, the skew match amount for the respective lane of the transmitter 200 is used to determine the selection control signal for the multiplexer 510. Each flip-flop represents a certain amount of delay, such as 1 UI, and the signal output by any given flip-flop is delayed by the cumulative delay from that flip-flop and any preceding flip-flop. For example, the signal output by flip-flop 604-1 is delayed 1 UI; the signal output by flip-flop 604-2 is delayed 2 UI; and signal output by flip-flop 604-31 is delayed 31 UI. The multiplexer 510 can be controlled to selectively output the signal with the delay, if any, that corresponds to the skew match amount.

Because the multiplexer 510 uses the selection control signal that is or is based on the skew match amount (e.g., in UI), the incoming serial data passes through flip-flops 604 (e.g., 604-1 to 604-31) corresponding to the skew match amount before passing through the multiplexer 510. Because the serial data passes through a number of flip-flops 604 corresponding to the skew match amount before passing through the multiplexer 510, the incoming data is correspondingly shifted to reduce lane-to-lane skew with the other lanes of the transmitter 200.

Figure 7A:
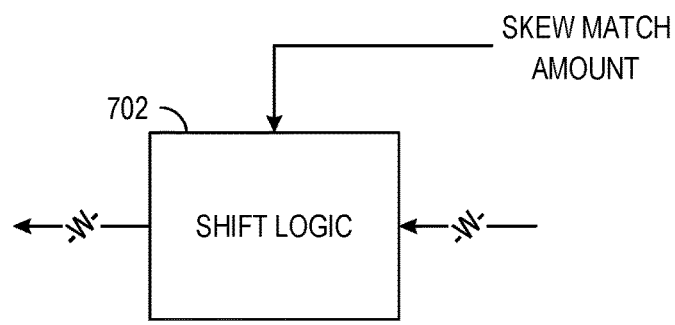
FIG. 7A illustrates an example PCS-based lane-to lane skew reduction technique, according to some examples.

FIG. 7A illustrates an example PCS-based lane-to-lane skew reduction technique, according to some examples. The PCS-based lane-to-lane skew reduction technique can reduce the lane-to-lane skew of serial data by shifting parallel data before passing the parallel data through the serializer.

In some examples, the PCS 214 of each lane comprises shift logic 702 to reduce the lane's clock skew for incoming parallel data. The shift logic 702 can be arranged to shift the incoming data, before or after the incoming parallel data passes through the phase alignment logic 504, based on the selector (e.g., the skew match amount) of the respective lane. The shift logic 702 includes a parallel shift register 704 (schematically shown in FIG. 7B), which maintains the incoming data for a given number of clock cycles and is capable of shifting out the data as per the total skew shift indicated (e.g., skew match amount). In some examples, the parallel shift register 704 maintains two cycles of data and is capable of shifting and outputting the parallel data from the PCS 214 based on the lane's skew match amount. The parallel shift register 704 is capable of receiving parallel data bits of two clock cycles and outputting contiguous bits in the parallel shift register 704 as parallel data bits each clock cycle based on the lane's skew match amount. In some examples, the shift logic 702 uses a multiplexer (e.g., shown in FIGS. 8A and 8B) for outputting data in the parallel shift register 704 based on the skew match amount. A visual representation of the example PCS-based lane-to-lane skew reduction technique is illustrated in FIGS. 8A-8B and 9A-9B.

Figure 7B:
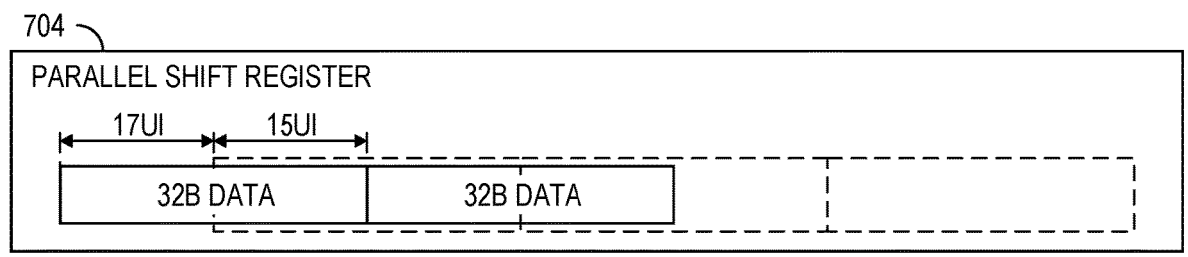
FIG. 7B is a graphical representation of the parallel shift register used with the shift logic in the PCS using a PCS shift register-based lane-to-lane skew reduction technique, according to some examples.

FIG. 7B is a graphical representation of the parallel shift register 704 used with the shift logic 702 in the PCS using a PCS shift register-based lane-to-lane skew reduction technique, according to some examples. The parallel shift register 704 can maintain data of any number of cycles. For example, the parallel shift register 704 can maintain two clock cycles of data, and one clock cycle of data comprises W-bits of parallel data. Accordingly, the parallel shift register 704 can maintain 2 W bits of data. The parallel shift register 704 shifts the data of the lower W-bits of the parallel shift register 704 to the upper W-bits of the parallel shift register 704 and writes received parallel W-bits of data to the lower W-bits of the parallel shift register 704 each clock cycle. FIG. 7B illustrates 2 clock cycles of data, where the one clock cycle of data comprises 32 bits of data, and hence, the parallel shift register 704 is 64 bits (e.g., b[63:0]). Any contiguous W-bits of data from the parallel shift register 704 are also output based on the lane's skew match amount each clock cycle. As shown in FIG. 7B as an example, the parallel shift register 704 outputs bits b[46:15] as a parallel data output, where the lower 15 bits of the upper 32 bits of data from a first clock cycle and the upper 17 bits of the lower 32 bits of data from a subsequent, second clock cycle form the output bits b[46:15].

Figure 8A:
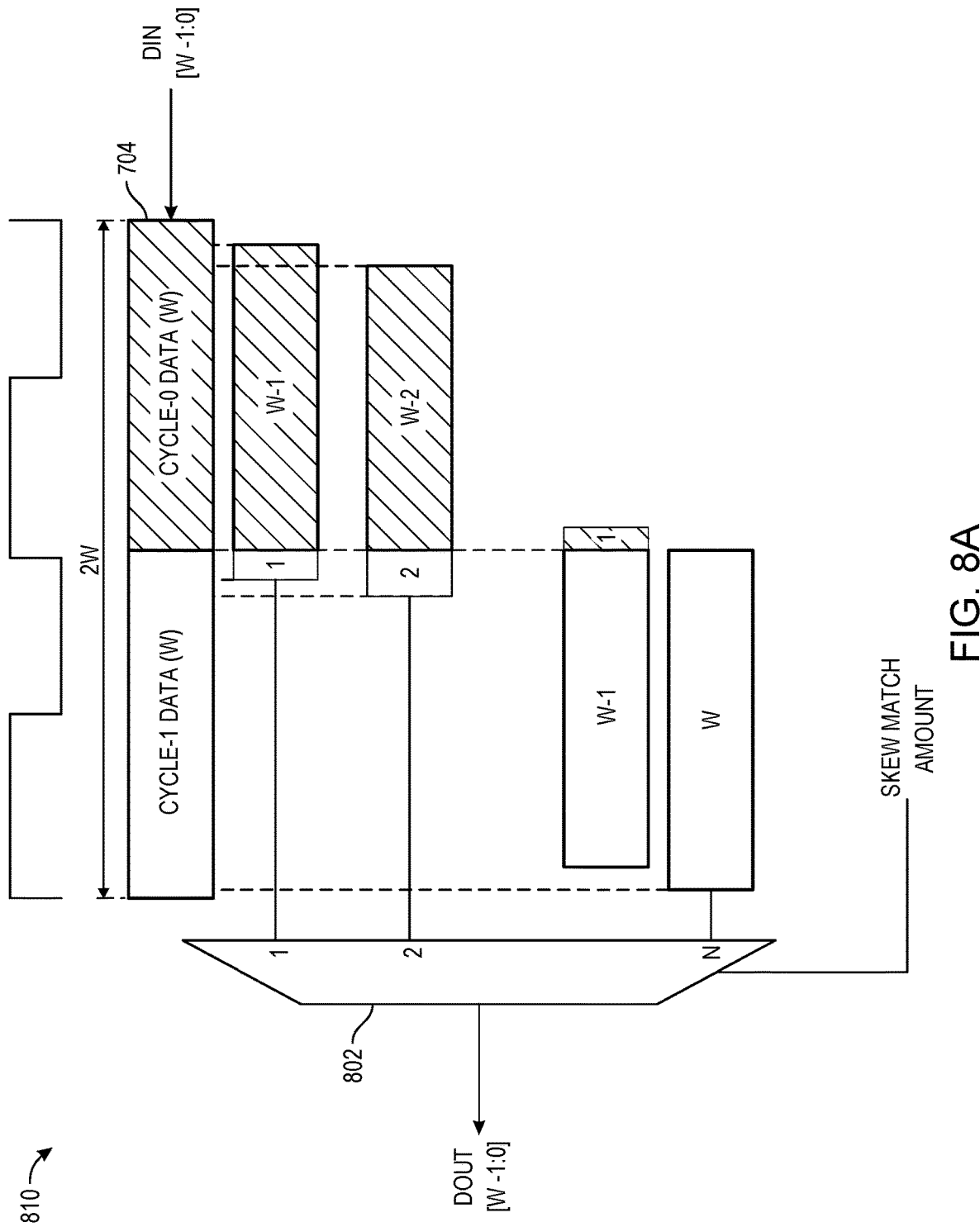
FIG. 8A illustrates example data flow using the example PCS-based lane-to-lane skew reduction technique, according to some examples.

FIG. 8A illustrates an example data flow using the example PCS-based lane-to-lane skew reduction technique of FIGS. 7A-7B according to some examples. In some examples, the shift logic 702 shifts parallel incoming data by a number of bits based on the skew match amount of the lane. The data flow 810 demonstrates how the parallel shift register 704 operates with a multiplexer 802 of the shift logic 702 to output data from the parallel shift register 704 based on the skew match amount. As illustrated in the data flow 810, the parallel shift register 704 has a size of 2 W, e.g., in order to support a clock skew up to W. In the illustrated example, the multiplexer 802 outputs W-bits of data in parallel, various bits of which may be received at the parallel shift register 704 during different clock cycles.

The parallel shift register 704 receives W-bits of parallel data during a clock cycle (e.g., DIN[W-1:0]), which are written to the lower W-bits of the parallel shift register 704 (e.g., Cycle-0 Data (W)). During the subsequent clock cycle, the lower W-bits of the parallel shift register 704 (e.g., Cycle-0 Data (W)) are shifted and written to the upper W-bits of the parallel shift register 704 (e.g., Cycle-1 Data (W)), and the parallel shift register 704 receives W-bits of parallel data, which are written to the lower W-bits of the parallel shift register 704 (e.g., Cycle-0 Data (W)).

The multiplexer 802 and parallel shift register 704 are configured to selectively output any contiguous W-bits of the parallel shift register 704 in parallel. For example, as illustrated in FIG. 8A, the multiplexer 802 outputs the upper W-1 bits of data from the Cycle-0 data in the parallel shift register 704 and the lower 1 bit of data from the Cycle-1 data in the parallel shift register 704 when the skew match amount is or indicates 1 UI. In some examples, the skew match amount can be extended above W by expanding the parallel shift register 704. In some examples, the maximum skew match amount is equal to N, where N is less than or equal to W.

Figure 8B:
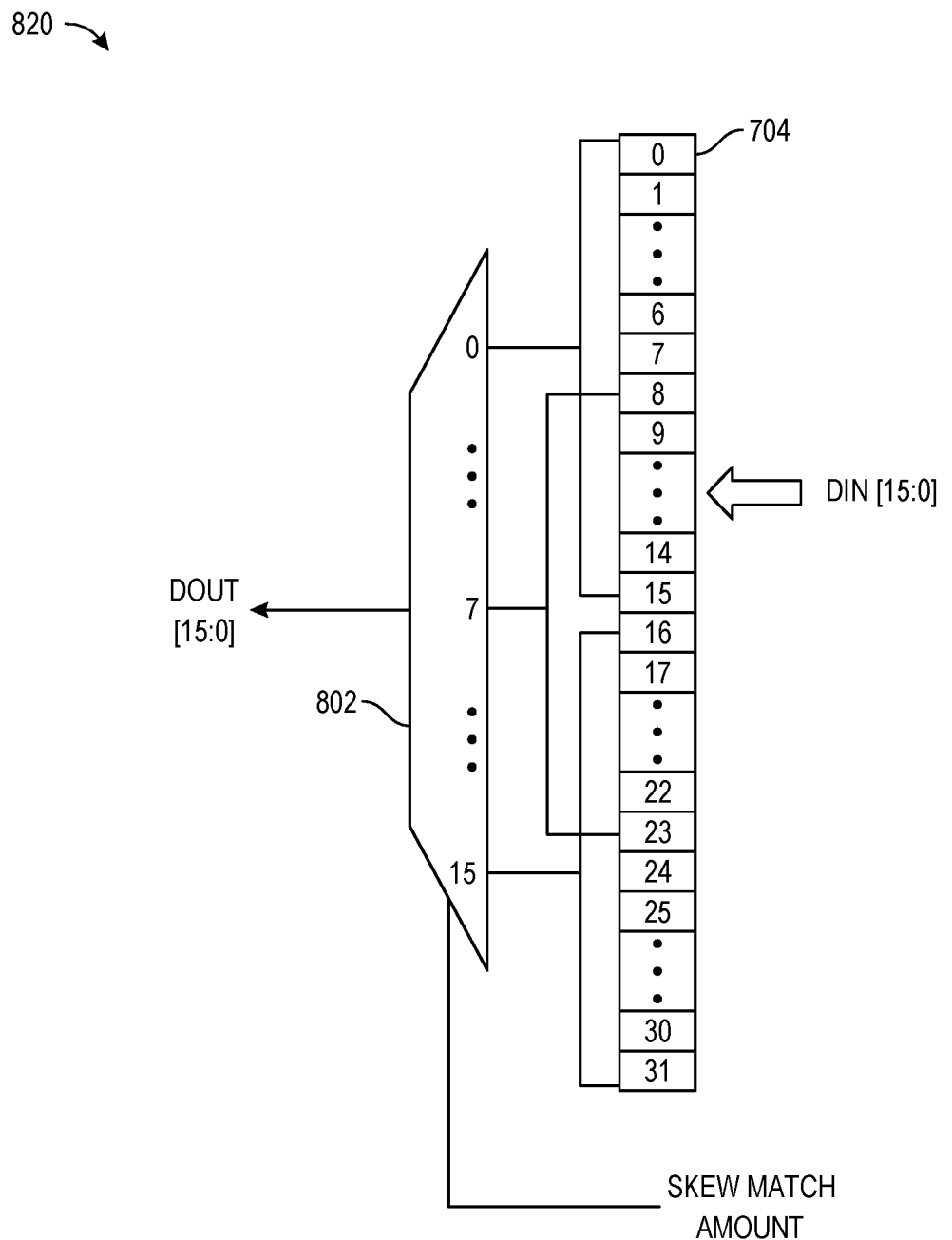
FIG. 8B illustrates the multiplexer coupled to the parallel shift registered to implement the example PCS-based lane-to-lane skew reduction technique, according to some examples.

FIG. 8B illustrates the multiplexer 802 coupled to the parallel shift register 704 to implement the example PCS-based lane-to-lane skew reduction technique, according to some examples. Specifically, FIG. 8B illustrates the parallel shift register 704 having a 32-bit width for a 16-bit wide data path, and each input of the multiplexer 802 is connected to multiple bits of the parallel shift register 704. For example, the input of "0" (corresponding to 0 UI skew match amount) is connected to bits 0 through 15 of the parallel shift register 704, and the input of "15" (corresponding to 15 UI skew match amount) is connected to bits 16-31 of the parallel shift register 704. Accordingly, when the multiplexer uses the lane's skew match amount as the selection control signal, the multiplexer 802 allows the corresponding bits to pass through (e.g., when the skew match amount is 0 UI, the multiplexer 802 outputs bits 0 through 15 of the parallel shift register). As with other examples, the shift logic 702 can use UI time units or any other time units for signals to the multiplexer 802.

The shifting of data passing through the PCS 214 using the PCS-based lane-to-lane skew reduction technique can account for the serialization of the parallel data, so that the lane-to-lane skew of the shifted data, when serialized, is reduced.

Figure 9A:
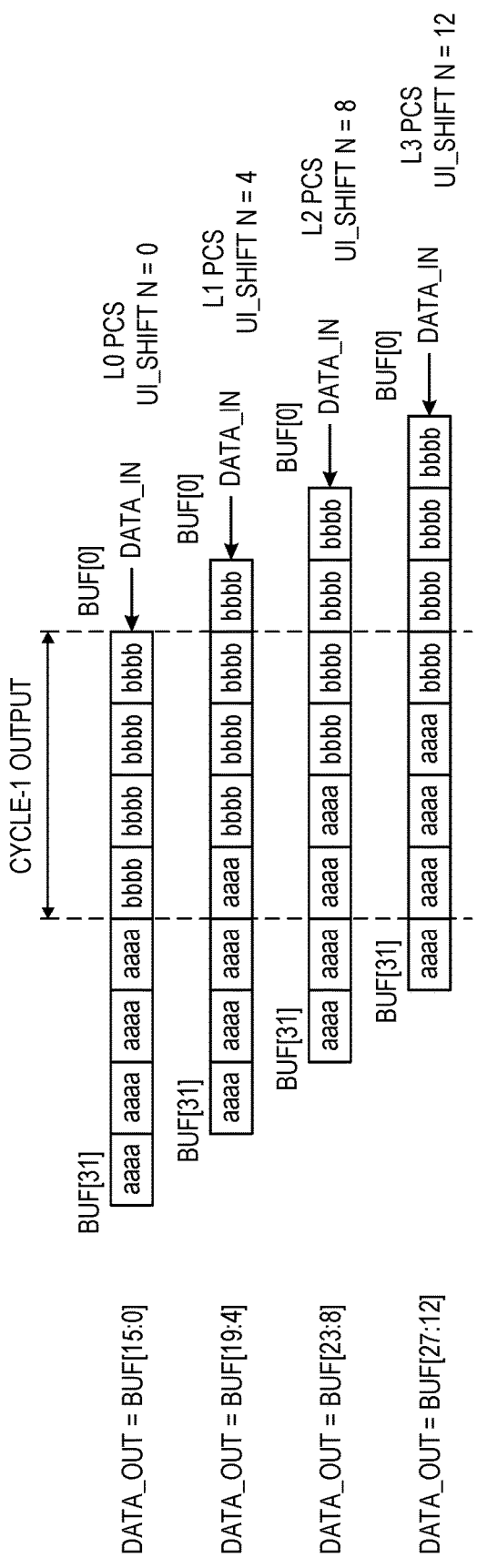
FIGS. 9A and 9B illustrate example of shift operations with a 16-bit parallel data input arriving at different times, according to some examples.
Figure 9B:
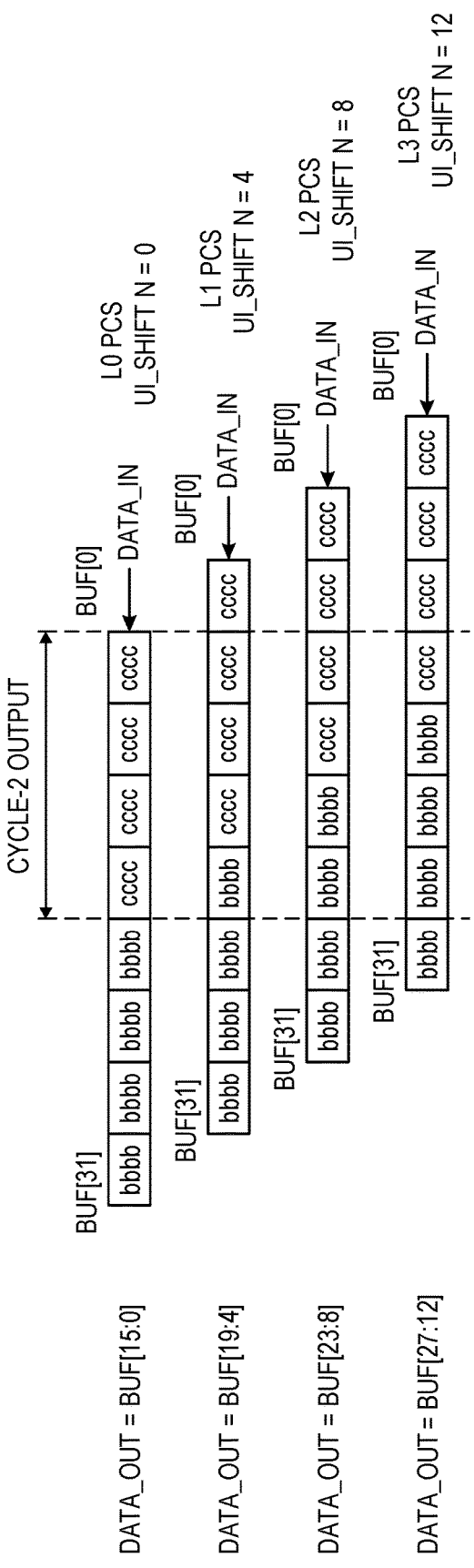

FIGS. 9A and 9B illustrate an example of shift operations with a 16-bit parallel data input arriving at different times (e.g., due to skews of clock signals), according to some examples. Because each lane has different clock skews, the arrival time of data signals can be different. The data signals are sent to a parallel shift register 704 (BUF[31:0]) and every cycle, the shift logic 702 shifts the lower W-bits of data in the parallel shift register 704 by W-bits to the upper W-bits in the parallel shift register 704. In some examples, the shift logic 702 outputs W-bits of parallel data, which may be any contiguous W-bits of the parallel shift register 704.

In order to compensate for clock skew, the shift logic 702 uses the skew match amounts as a basis for the shift. For example, lanes L0, L1, L2, L3 have skew match amounts of 0 UI, 4 UI, 8 UI, and 12 UI respectively, and the values 0, 4, 8, and 12 can be set as the skew match amount for the respective lanes to shift out data. As illustrated in FIG. 8B, each lane outputs 16-bits of data from the parallel shift register 704, with the corresponding skew match amounts, and so some data might not be available to output until a later cycle, after the data in the parallel shift register shifts inside the parallel shift register based on what was outputted.

FIGS. 9A and 9B illustrate the contents of the parallel shift register 704 (BUF[31:0]) of each lane L0, L1, L2, L3 at clock cycle Cycle-1 and clock cycle Cycle-2, respectively. Each lane receives 16 bits of "a" data at corresponding clock cycles Cycle-0, which may have different clock skews for the different lanes that results in the 16 bits arriving at different times. Similarly, each lane receives 16 bits of "b" data at corresponding clock cycles Cycle-1, which may have different clock skews resulting in the bits arriving at different times, and each lane receives 16 bits of "c" data at corresponding clock cycles Cycle-2, which may have different clock skews resulting in the bits arriving at different times. For each clock cycle, the received 16 bits of data are written to the lower 16 bits of the parallel shift register 704 (e.g., BUF[15:0]). For each clock cycle, the lower 16 bits of the parallel shift register 704 (e.g., BUF[15:0]) that were written by the previous clock cycle are shifted to the upper 16 bits of the parallel shift register 704 (e.g., BUF[31:16]).

FIG. 9A illustrates indicates the output of the shift logic 702 at clock cycle Cycle-1. For lane L0, the UI shift amount is 0 (UI_SHIFT N=0), so the data received at clock cycle Cycle-1 at lane L0 (e.g., 16 bits of "b" data) is output (e.g., DATA_OUT=BUF[15:0]) at clock cycle Cycle-1 without any shifting of data. For lane L1, the UI shift amount is 4 (UI_SHIFT N=4), so 4 bits of data received at the previous clock cycle Cycle-0 (e.g., 4 bits of "a" data) and 12 bits of the data received at clock cycle Cycle-1 (e.g., 12 bits of "b" data) at lane L1 is output (e.g., DATA_OUT=BUF[19:4]) at clock cycle Cycle-1. Hence, lane L1 shifts data four bits. Similarly, lane L2 shifts data 8 bits, and lane L3 shifts data 12 bits.

FIG. 9B illustrates indicates the output of the shift logic 702 at clock cycle Cycle-2. For lane L0, the UI shift amount is 0 (UI_SHIFT N=0), so the data received at clock cycle Cycle-2 at lane L0 (e.g., 16 bits of "c" data) is output (e.g., DATA_OUT=BUF[15:0]) at clock cycle Cycle-2 without any shifting of data. For lane L1, the UI shift amount is 4 (UI_SHIFT N=4), so 4 bits of data received at the previous clock cycle Cycle-1 (e.g., 4 bits of "b" data) and 12 bits of the data received at clock cycle Cycle-2 (e.g., 12 bits of "c" data) at lane L1 is output (e.g., DATA_OUT=BUF[19:4]) at clock cycle Cycle-2. Hence, lane L1 shifts data four bits. Similarly, lane L2 shifts data 8 bits, and lane L3 shifts data 12 bits.

Figure 10:
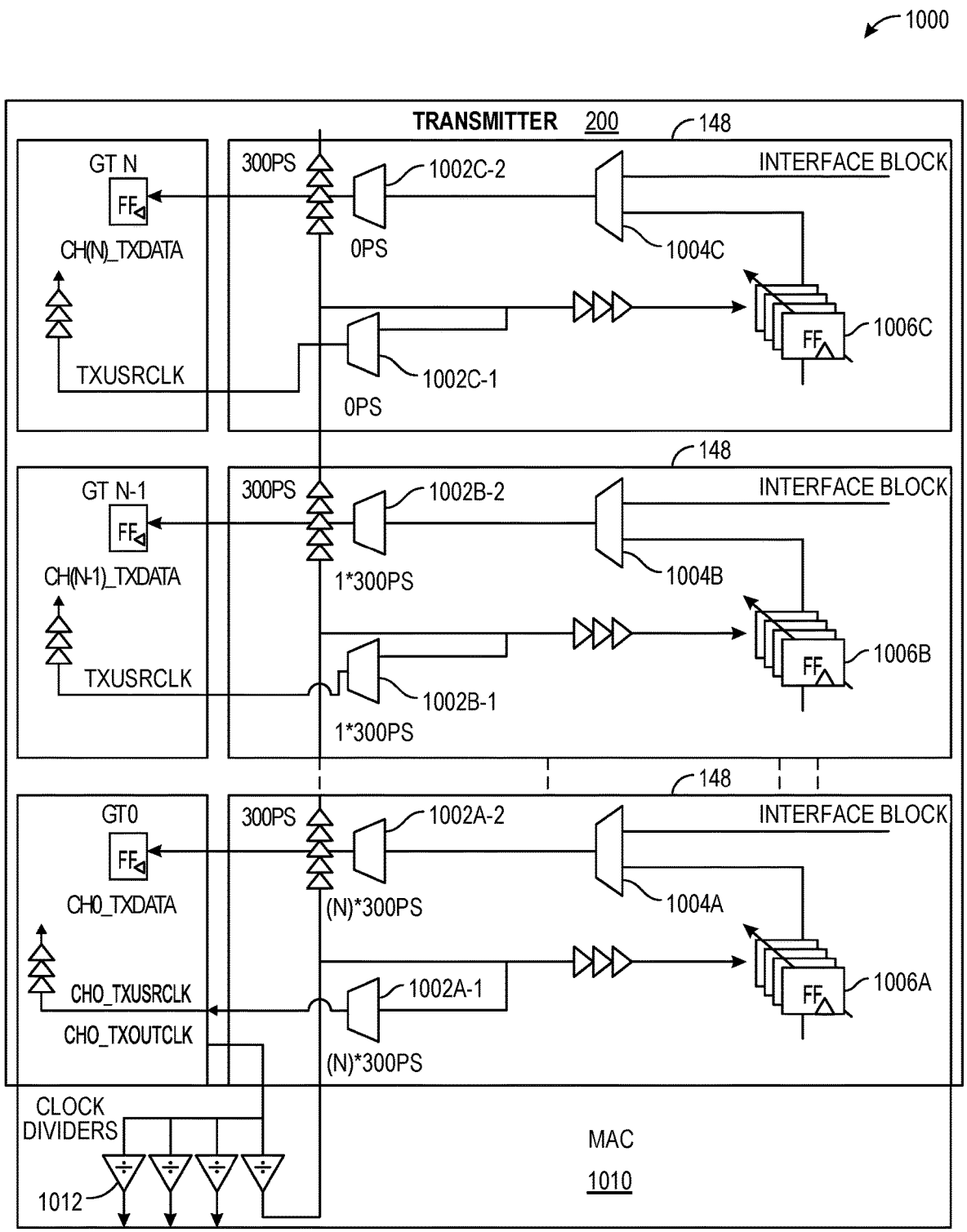
FIG. 10 illustrates an example of a multi-lane system using an example lane-to-lane skew reduction technique, according to some examples.

FIG. 10 illustrates an example of a multi-lane system using an example lane-to-lane skew reduction technique, according to some examples. In such examples, the multi-lane system 1000 comprises interface blocks 148 having programmable delay logic, which adjusts the clock signal and incoming data prior to the gigabit transceiver (GT) (GT 0 through GT N) receiving the adjusted clock signal and adjusted incoming data.

The multi-lane system 1000 includes a Media Access Controller (MAC) block 1010, N GTs, and N interface blocks 148. The multi-lane system 1000 can have any number of GTs, and the number of interface blocks 148 (e.g., interface blocks 148 of FIG. 1) corresponds to the number of GTs of the multi-lane system 1000. The multi-lane system 1000 can be incorporated into an IC (e.g., programmable IC 100).

The MAC block 1010 transmits a clock signal to each of the interface blocks 148, and comprises clock dividers 1012. In some examples, the MAC block 1010 receives a reference clock signal (e.g., TXOUTCLK) from the reference GT (e.g., GT 0). The clock dividers 1012 of the MAC block 1010 takes the reference clock signal from the reference GT, and divides the frequency of the reference clock signal into another clock signal with a lower frequency, which is sent to the interface blocks 148 of the multi-lane system 1000. The MAC block 1010 can include other logic components for receiving and transmitting clock signals.

While only three GTs (GT 0, GT N−1, and GT N) are illustrated in FIG. 10, each GT (GT 0 through GT N) has any number of lanes and corresponding interface blocks 148, and each GT (GT 0 through GT N) can have similar dimensions. In some examples, the height of each GT (GT 0 through GT N) is 1500 μm and can contribute about 300 ps skew to the clock signal. In some examples, the GTs (GT 0 through GT N) are instantiated multiple times in a programmable IC to support higher bandwidth applications. In some examples, each lane of each GT (GT 0 through GT N) is individually driven by the clock signal (e.g., USRCLK). Due to the size of the GT (GT 0 through GT N), skew may be inherent between clock signals across different lanes within a GT (GT 0 through GT N).

In some examples, the lanes of the GTs (GT 0 through GT N) run in Buffer Bypass mode for low latency applications, which aligns the physical interface clock signal (e.g., TXPHYCLK) phase to that of the user clock signal (e.g., TXUSRCLK). The USRCLK clock signal is shared for all lanes and this will translate the clock signal skew to serial lane skew. The user clock signal is normally generated from transmitter clock signal (e.g., TXOUTCLK), which is also used in MAC block 1010.

As illustrated in the FIG. 10, each interface block 148 comprises programmable delay logic 1002. In some examples, the interface block 148 comprises multiple programmable delay logic 1002, one for the clock signal (e.g., programmable delay logic 1002-1) and one for incoming data (e.g., programmable delay logic 1002-2). The interface blocks 148 can include any number of programmable delay logic 1002 for reducing lane-to-lane skew for the clock signal and for incoming data transmitted to the GTs (GT 0 through GT N). The programmable delay logic 1002 is programmed based on the skew match amount calculated based on the reference GT (e.g., any of GT 0 through GT N). The lane-to-lane skew reduction techniques disclosed herein can apply to GTs as well as lanes of a GT, and accordingly, each GT has a clock skew of the incoming clock signal (e.g., USRCLK) and has a corresponding skew match amount. For example, using GT 0 as a reference GT, GT N has the worst skew because the clock signal travels the longest distance before reaching GT N, therefore GT N's clock skew is also the maximum clock skew. Based on the maximum clock skew, the programmable delay logic 1002 is configured to delay the clock signal and incoming data to the GTs with a corresponding skew match amount, so that when the clock signal and incoming data is sent to the GTs, each GT receives the clock signal and incoming data at approximately the same time.

Reference may be made generally to a programmable delay logic 1002, which applies to any one of the programmable delay logic 1002a-1, 1002a-2, 1002b-1, 1002b-2, 1002c-1, and 1002c-2. Similarly, reference may be made generally to a component of the interface blocks, which applies to the corresponding component of the interface blocks of other lanes or GTs.

Figure 11:
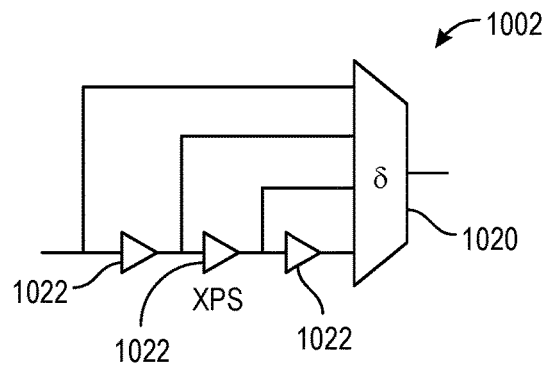
FIG. 11 illustrates programmable delay logic of the multi-lane system using a lane-to-lane skew reduction technique, according to some examples.

FIG. 11 illustrates programmable delay logic 1002 of the multi-lane system 1000 of FIG. 10 using a lane-to-lane skew reduction technique according to some examples. In some examples, the programmable delay logic 1002 comprises a multiplexer 1020 and buffers 1022. The buffers 1022 are serially connected such that the output node of a preceding buffer 1022 is connected to an input node of the subsequent buffer 1022. An input node of the first buffer 1022 of the serially connected buffers 1022 is connected to an input node of the multiplexer 1020 such that a signal can bypass the buffers 1022 to the multiplexer 1020. The output node of each buffer 1022 is also connected to a respective input node of the multiplexer 1020. The number of buffers 1022 of the programmable delay logic 1002 can correspond to the range of shifting the programmable delay logic 1002 is capable of performing. The configuration to select, by the multiplexer 1020, which output signal from the buffers 1022 to output from the multiplexer 1020 corresponds to the skew match amount. In some examples, the skew match amount uses UI time units, and the number of buffers 1022 (3 buffers as illustrated in FIG. 11) corresponds to the number of UIs of the skew match amount (e.g., 3 UI) that the programmable delay logic 1002 is capable of shifting. In other examples, the skew match amount uses seconds as time units, and each buffer 1022 corresponds to 300 ps of clock skew. Thus the total clock skew based on the buffers 1022 corresponds to the skew match amount (e.g., 900 ps) that the programmable delay logic 1002 is capable of shifting.

Going back to FIG. 10, the MAC block 1010 passes the clock signal from its clock dividers 1012 to each interface block 148 of the multi-lane system 1000, and the interface blocks 148 receive the clock signal with programmable delay logic 1002-1 of the interface block. The number of buffers 1022 through which a clock signal is passed to delay the clock signal before being output by the respective programmable delay logic 1002 depends on the corresponding GT and its clock skew. For example, for programmable delay logic 1002*a*-1, the number of buffers 1022 through which a clock signal is passed to delay the clock signal before being output by the programmable delay logic 1002*a*-1 is N; for programmable delay logic 1002*b*-1, the number of buffers 1022 through which a clock signal is passed to delay the clock signal before being output by the programmable delay logic 1002*b*-1 is one; and the clock signal does not pass through buffers 1022 before being output by the programmable delay logic 1002*c*-1. The first programmable delay logic 1002-1 passes the buffered clock signal to the corresponding GT.

In some examples, the programmable delay logic 1002 comprises a set number of buffers, and the multiplexer 1020 comprises a selection control signal based on the skew match amount. The multiplexer 1020 uses the selection control signal for buffering the incoming data based on the skew match amount.

The clock signal from the MAC block 1010 also routes to a series of flip-flops 1006. Reference may be made generally to flip-flops 1006, which applies to any one of the flip-flops 1006*a*, 1006*b*, 1006*c* or any other flip-flops in the interface blocks 148. The flip-flops 1006 can be used as a pipeline for data received by the transmitter 200, and can also receive the clock signal from the MAC block 1010 for triggering the flip-flops 1006. The data propagates through the flip-flops 1006 to a multiplexer 1004 (which can refer to any one of multiplexer 1004*a*, 1004*b*, 1004*c* or any other multiplexer in the interface blocks 148). The multiplexer 1004 can be configured to transmit the data propagated through the flip-flops 1006 or another data signal from another component of the programmable IC (e.g., incoming data). In some examples, the data passes through the multiplexer 1004, and then passes through the programmable delay logic 1002-2. Like programmable delay logic 1002-1, the programmable delay logic 1002-2 buffers the data signal from the multiplexer 1004 based on corresponding GT's clock skew and the skew match amount, and transmits the buffered data signal to the GT.

In some examples, the GTs (GT 0 through GT N) can implement the lane-to-lane skew reduction techniques embedded in the PMA 212 and in the PCS 214.

Figure 12:
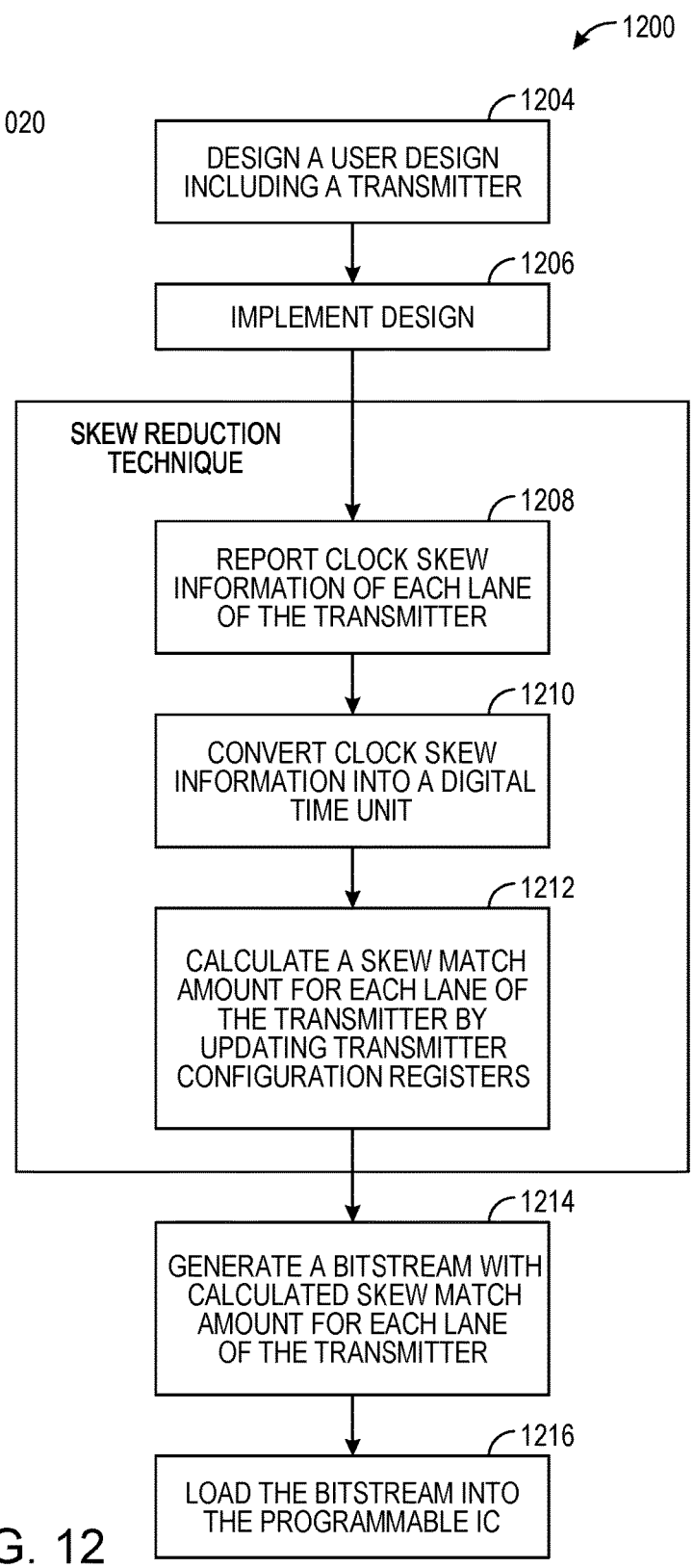
FIG. 12 is a flow chart of a lane-to-lane skew reduction technique for a programmable IC, according to some examples.

FIG. 12 is a flow chart of a lane-to-lane skew reduction technique for a programmable IC, such as an FPGA, according to some examples. The flowchart comprises operations 1200, at least some of which can be performed by a computer. In some examples, the computer can execute an application for various ones of operations 1200, and the application can be the Vivado® Design Suite available from Xilinx, Inc. of San Jose, Calif., a design tool for designing user designs and generating bitstreams from the user design for programmable ICs, such as FPGAs. The programmable IC can implement lane-to-lane skew reduction, such as by implementing a user design. For example, operations 1200 can generate a bitstream of a user design to be implemented on the architecture of FIG. 1. The computer performs various ones of operations 1200 to reduce lane-to-lane clock skew of a transmitter of the programmable IC.

Operations 1200 begin, at block 1204, where a user design including the transmitter 200 is designed. The user design is to be implemented on the programmable IC. In some examples, the transmitter 200 is a multi-lane GT. The design can include fabric logic and hard MACs. The transmitter can include clock skews for each GT and/or lane of the transmitter.

At block 1206, the design is implemented. In some examples, implementation of the user design includes synthesis, timing analysis, floor planning, place and route, etc. In some examples, implementation of the user design can also include bitstream generation. Implementation can be performed at the end of an IC design process.

At block 1208, the clock skew information is reported. In some examples, the clock skew information includes the clock skew for each lane, and can also include the maximum clock skew of the transmitter. In some examples, when a computer runs a timing analysis, the computer determines the clock skew for each lane of the transmitter, as described with operations 400. The maximum clock skew can be determined from the clock skew for each lane, as described with operations 400. In some examples, clock skew information is determined for each transmitter.

At block 1210, the clock skew information is converted into a digital time unit (e.g., UIs) for each lane of the transmitter 200.

At block 1212, a skew match amount is calculated for each lane of the transmitter 200, as described with operations 400. In some examples, the skew match amount is determined for each lane of the transmitter of the programmable IC. In some examples, the respective skew match amount is applied to each lane of the transmitter by updating the transmitter configuration registers.

At block 1214, a bitstream is generated with the calculated skew match amount for each lane of the transmitter 200. In some examples, the bitstream comprises information used to configure the programmable IC to accommodate for the clock skew. The information in the bitstream comprises configuration data corresponding to the skew match amount for each lane of the transmitter, and the configuration data configures the transmitter according to the skew match amount.

At block 1216, the bitstream is loaded into the programmable IC, and the programmable IC operates based on the configuration of the bitstream. Because the bitstream comprises configuration data corresponding to the skew match amount for each lane of the transmitter, the programmable IC is configured using the skew match amount. Accordingly, when the programmable IC performs processes, the programmable IC uses a clock signal skewed using the lane-to-lane skew reduction techniques described herein.

Figure 13:
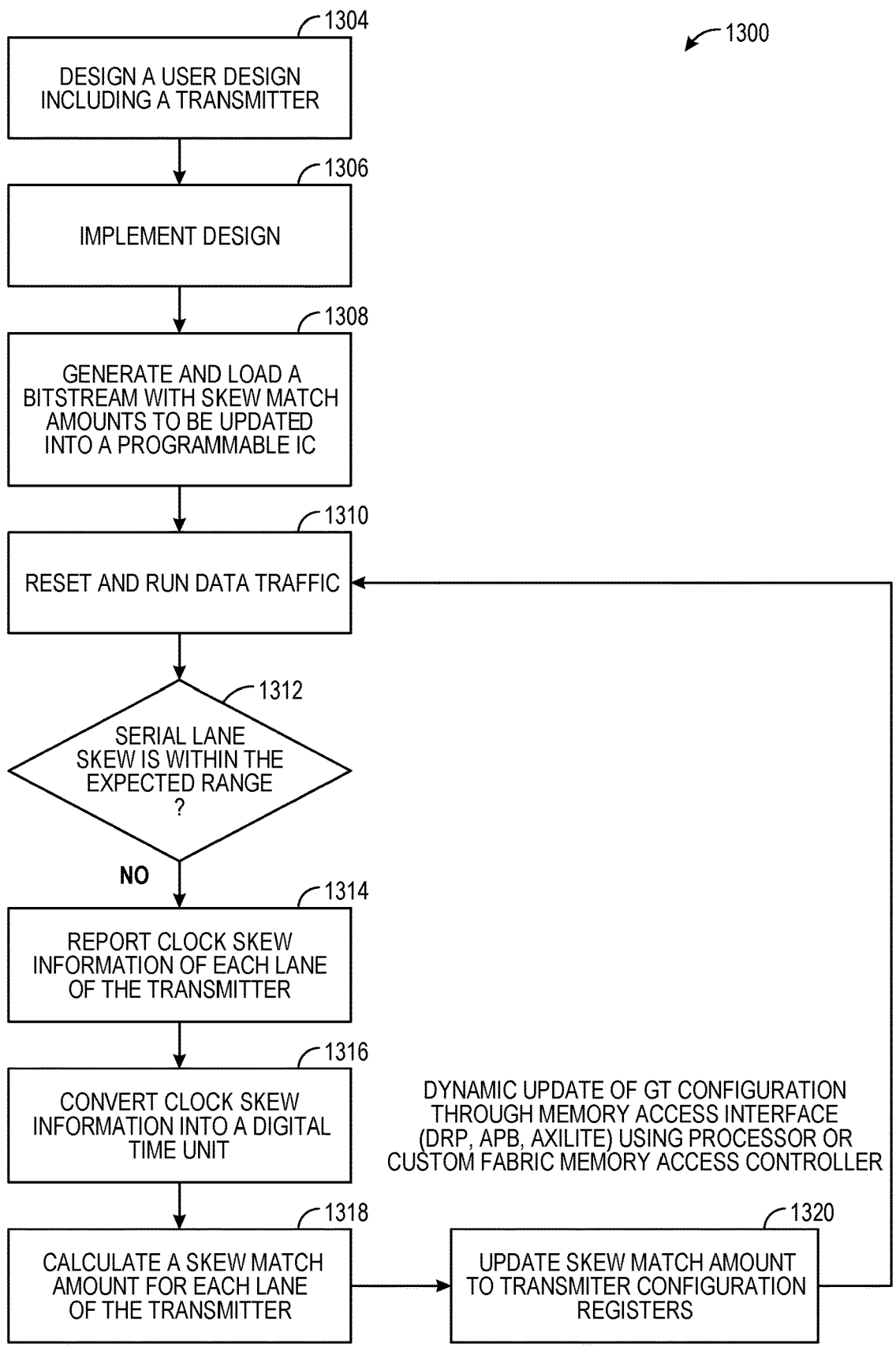
FIG. 13 is a flow chart of a lane-to-lane skew reduction technique for a programmable IC, according to some examples.

FIG. 13 is a flow chart of a lane-to-lane skew reduction technique for a programmable IC, such as an FPGA, according to some examples. The flowchart comprises operations 1300, at least some of which can be performed by a computer. In some examples, the computer can execute an application for various ones of operations 1300, and the application can be the Vivado® Design Suite available from Xilinx, Inc. of San Jose, Calif., a design tool for designing user designs and generating bitstreams from the user design for programmable ICs, such as FPGAs. The programmable IC can implement lane-to-lane skew reduction, such as by implementing a user design. For example, operations 1300 can generate a bitstream of a user design to be implemented on the architecture of FIG. 1. The computer performs various ones of operations 1300 to reduce lane-to-lane clock skew of a transmitter of the programmable IC.

Operations 1300 begin, at block 1304, wherein a user design including the transmitter 200 is designed. The user design is to be implemented on the programmable IC. In some examples, the transmitter 200 is a multi-lane GT. The design can include fabric logic and hard MACs. The transmitter can include clock skews for each GT and/or lane of the transmitter.

At block 1306, the design is implemented. In some examples, implementation of the user design includes synthesis, timing analysis, floor planning, place and route, etc. In some examples, implementation of the user design can also include bitstream generation. Implementation can be performed at the end of an IC design process.

At block 1308, a bitstream is generated and loaded into the programmable IC. In some examples, the bitstream may or may not comprise information used to configure the programmable IC to accommodate the clock skew. In some examples, the bitstream corresponds to the design implemented at block 1306. the bitstream is loaded into the programmable IC, and the programmable IC operates based on the configuration of the bitstream. When the bitstream is loaded into the programmable IC, a portion of the configuration can be dynamically updated through a memory-mapped access interface, such as a Dynamic Reconfiguration Port (DRP), Advanced Peripheral Bus (APB), and Advanced eXtensible Interface Lite (AXILite). The configuration can be dynamically updated to include configuration data corresponding to the skew match amounts for each lane of the transmitter. For example, configuration registers of the transmitter may be written via a memory-mapped access to store configuration data corresponding to lane's skew match amounts.

At block 1310, the transmitter is reset and runs the data traffic. In some examples, the transmitter is reset after an update of the skew match amount. In some examples, the transmitter runs based on the configuration from the bitstream loaded onto the programmable IC.

At block 1312, the serial lane-to-lane skew for each lane is examined for whether it falls within an expected range. If it does not fall within an expected range, then operations 1300 proceeds to block 1314. In some examples, if the serial lane-to-lane skew falls within an expected range, then the lane-to-lane skew reduction technique need not be performed on the programmable IC. In some examples, an expected range for the serial lane-to-lane skew varies based on protocols because each protocol has its own serial lane skew.

At block 1314, the clock skew information is reported. In some examples, the clock skew information includes the clock skew for each lane, and can also include the maximum clock skew of the transmitter. In some examples, when a computer runs the timing analysis, the computer determines the clock skew for each lane of the transmitter, as described with operations 400. The maximum clock skew can be determined from the clock skew for each lane, as described with operations 400. In some examples, clock skew information is determined for each transmitter At block 1316, the clock skew information is converted into a digital time unit (e.g., UIs) for each lane of the transmitter 200.

At block 1318, a skew match amount is calculated for each lane of the transmitter 200, as described with operations 400. In some examples, the skew match amount is determined for each lane of the transmitter of the programmable IC.

At block 1320, the skew match amount for each lane of the transmitter 200 is updated. In some examples, the respective skew match amount is applied to each lane of the transmitter by updating the transmitter configuration registers. In such examples, the updates to the transmitter configuration registers are applied to the programmable IC. In some examples, after the skew match amounts for each lane are updated, operations 1300 goes back to block 1310 so that the programmable IC is reset. In such examples, the programmable IC is reset because an update to the configuration registers can disrupt current data traffic of the programmable IC.

Figure 14:
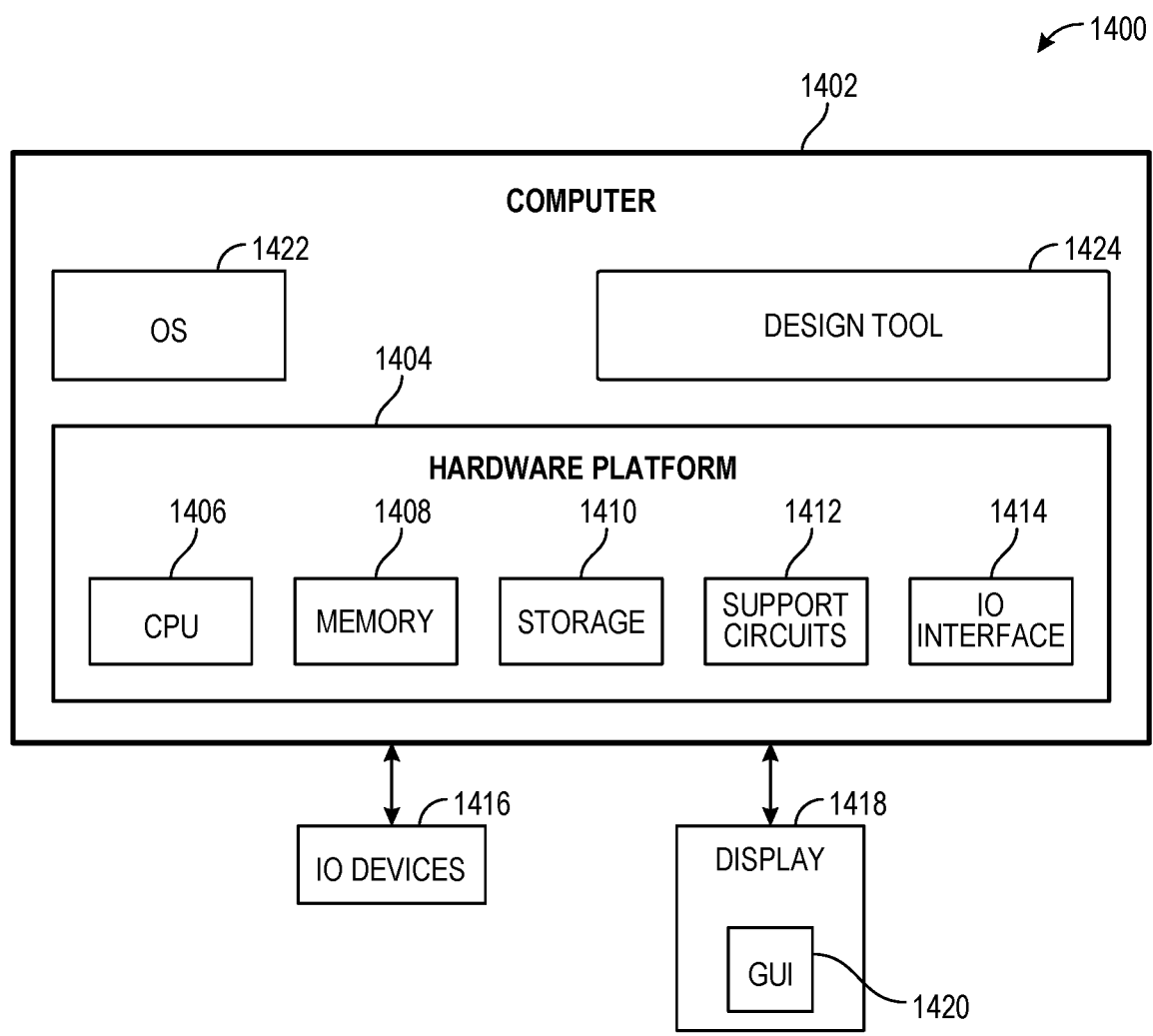
FIG. 14 is a block diagram depicting an example of an application design system that can be used to generate a user design and corresponding bitstream that implements a lane-to-lane skew reduction technique, in accordance with some examples.

FIG. 14 is a block diagram depicting an example of an application design system 1400 that can be used to generate a user design and corresponding bitstream that implements a lane-to-lane skew reduction technique, in accordance with some examples. The application design system 1400 (e.g., a processor-based system) can be used by a user to create a user design that can be compiled to generate a bitstream that can be loaded on the programmable IC 100 of FIG. 1, for example. The application design system 1400 includes a computer 1402 coupled to input/output (IO) devices 1416 and a display 1418. The computer 1402 includes a hardware platform 1404 that can include components of a computing device, such as a central processing unit (CPU) 1406, system memory 1408, storage 1410, various support circuits 1412, and an IO interface 1414. The CPU 1406 can include one or more microprocessors. The CPU 1406 is configured to execute program instruction code that performs one or more operations described herein. The program instruction code can be stored in system memory 1408, storage 1410, or any other memory in the hardware platform 1404 (e.g., cache memory). The system memory 1408 includes one or more non-transitory storage mediums that store information and can include, for example, random access memory (RAM), read-only memory (ROM), or a combination thereof. The storage 1410 includes one or more local non-transitory storage mediums, such as hard disks, flash memory modules, solid state disks, optical disks, and the like. The storage 1410 can also include interface(s) configured for communication with one or more network data storage systems. The support circuits 1412 can include cache, power supplies, clock circuits, data registers, IO interfaces, and the like. The IO interface 1414 includes interfaces to/from the computer 1402. The IO interface 1414 can be coupled to the IO devices 1416, which can include a keyboard, mouse, and the like. The IO interface 1414 can also be coupled to the display 1418, which can present a graphical user interface (GUI) 1420 to a user.

The computer 1402 further includes a software platform comprising an operating system (OS) 1422 and a design tool 1424. The OS 1422 and the design tool 1424 include program instruction code that is executed by the CPU 1406, which program instruction code can be stored in system memory 1408, storage 1410, or any other memory. The OS 1422 can include any known operating system, such as Linux®, Microsoft Windows®, Mac OS®, and the like. The design tool 1424 is an application that executes within the OS 1422, which provides an interface to the hardware platform 1404. Some operations of the design tool 1424 include various ones of the operations 400 of FIG. 4, operations 1200 of FIG. 12, and/or operations 1300 of FIG. 13.

The various examples described herein may employ various computer-implemented operations involving data stored in computer systems. For example, these operations may require physical manipulation of physical quantities usually, though not necessarily, these quantities may take the form of electrical or magnetic signals, where they or representations of them are capable of being stored, transferred, combined, compared, or otherwise manipulated. Further, such manipulations are often referred to in terms, such as producing, identifying, determining, or comparing. Any operations described herein that form part of one or more embodiments of the invention may be implemented as useful machine operations. In addition, one or more examples also relate to a device or an apparatus for performing these operations. The apparatus may be specially constructed for specific required purposes, or it may be a general purpose computer selectively activated or configured by a computer program stored in the computer. In particular, various general purpose machines may be used with computer programs written in accordance with the teachings herein, or it may be more convenient to construct a more specialized apparatus to perform the required operations.

The various examples described herein may be practiced with other computer system configurations including handheld devices, microprocessor systems, microprocessor-based or programmable consumer electronics, minicomputers, mainframe computers, and the like.

One or more examples may be implemented as one or more computer programs or as one or more computer program modules embodied in one or more computer readable media. The term computer readable medium refers to any data storage device that can store data which can thereafter be input to a computer system computer readable media may be based on any existing or subsequently developed technology for embodying computer programs in a manner that enables them to be read by a computer. Examples of a computer readable medium include a hard drive, a Solid State Disk (SSD), network attached storage (NAS), read-only memory, random-access memory (e.g., a flash memory device), a CD (Compact Discs) CD-ROM, a CD-R, or a CD-RW, a DVD (Digital Versatile Disc), a magnetic tape, and other optical and non-optical data storage devices. The computer readable medium can also be distributed over a network coupled computer system so that the computer readable code is stored and executed in a distributed fashion.

The methods disclosed herein comprise one or more steps or actions for achieving the methods. The method steps and/or actions may be interchanged with one another without departing from the scope of the claims. In other words, unless a specific order of steps or actions is specified, the order and/or use of specific steps and/or actions may be modified without departing from the scope of the claims. Further, the various operations of methods described above may be performed by any suitable means capable of performing the corresponding functions. The means may include various hardware and/or software component(s) and/or module(s), including, but not limited to a circuit, an application specific integrated circuit (ASIC), or processor. Generally, where there are operations illustrated in figures, those operations may have corresponding counterpart means-plus-function components with similar numbering.

While the foregoing is directed to specific examples, other and further examples may be devised without departing from the basic scope thereof, and the scope thereof is determined by the claims that follow.

What is claimed is:

1. A method for reducing lane-to-lane clock skew in an integrated circuit (IC), the method comprising:
   using a processor-based system:
      determining a maximum clock skew from clock skews of respective lanes of a transmitter, each of the clock skews corresponding to a skew of a clock signal of the respective lane relative to a same reference clock signal; and
      determining a skew match amount for each lane of the lanes of the transmitter, wherein:
         the skew match amount for a respective lane of the lanes is based on the maximum clock skew and the clock skew of the respective lane, and
         the clock skew of the respective lane is a function of a distance of the respective lane from the lane corresponding to the maximum clock skew; and
      generating configuration data to configure the transmitter to shift incoming data for each lane of the lanes based on the skew match amount for the respective lane.

2. The method of claim 1, wherein determining the maximum clock skew comprises converting the clock skews of the lanes of the transmitter into digital unit intervals.

3. The method of claim 1, wherein the clock skew of the respective lane is a function of a total number of the lanes and of the distance of the respective lane from the lane corresponding to the maximum clock skew.

4. The method of claim 1, wherein a sum of the skew match amount and the clock skew of the respective lane matches the maximum clock skew.

5. The method of claim 1, wherein determining the maximum clock skew comprises measuring the clock skew for each lane of the lanes of the transmitter from a reference lane having the reference clock signal.

6. The method of claim 1, wherein the configuration data configures the transmitter to shift the clock signal for each lane of the lanes based on the skew match amount of the respective lane.

7. The method of claim 1, wherein the configuration data is included in a bitstream.

8. The method of claim 1, further comprising dynamically updating a configuration of the IC with the skew match amount for each lane of the transmitter through a memory access interface.

9. The method of claim 1, wherein the transmitter comprises phase alignment logic to phase align the incoming data received from a first clock domain input to a second clock domain.

10. An integrated circuit (IC) comprising:
    a transmitter comprising transmission lanes, wherein:

each of the transmission lanes has a clock skew relative to a same reference clock signal; and each of the transmission lanes comprises programmable shift logic configurable to shift a signal based on a skew match amount, the skew match amount for a respective transmission lane being based on the clock skew of the respective transmission lane and a maximum clock skew of the clock skews of the transmission lanes, and the clock skew of the respective transmission lane being a function of a distance of the respective transmission lane from the lane corresponding to the maximum clock skew.

11. The IC of claim 10, wherein each of the transmission lanes comprises a Physical Coding Sub-Layer (PCS), and the PCS comprises the programmable shift logic.

12. The IC of claim 11, wherein the programmable shift logic comprises a shift register configured to maintain the signal for a number of clock cycles and shift out the signal based on the skew match amount.

13. The IC of claim 10, wherein each of the transmission lanes comprises a Physical Medium Attachment (PMA), and the PMA comprises the programmable shift logic.

14. The IC of claim 13, wherein each of the transmission lanes comprises a multiplexer, and the programmable shift logic of each of the transmission lanes comprises a plurality of serially connected flip-flops, wherein each of the serially connected flip-flops has an output node connected to a respective input node of the multiplexer, the multiplexer being controlled based on the skew match amount to selectively output a signal output by one of the serially connected flip-flops.

15. The IC of claim 10, wherein each of the transmission lanes comprises a transceiver and an interface block, the interface block comprising the programmable shift logic, the programmable shift logic being configurable to transmit a skewed clock signal to the transceiver, the skewed clock signal being skewed based on the skew match amount for the respective transmission lane.

16. The IC of claim 15, wherein the programmable shift logic comprises serially connected buffers and a multiplexer, wherein output nodes of the serially connected buffers are connected to respective input nodes of the multiplexer, the multiplexer being controlled based on the skew match amount to selectively output a signal output by one of the serially connected buffers.

17. The IC of claim 15, wherein interface block further comprises additional programmable shift logic configurable to shift a data signal based on the skew match amount for the respective transmission lane.

18. The IC of claim 10, wherein the programmable shift logic comprises a multiplexer and a serial shift register, output nodes of the serial shift register being connected to respective input nodes of the multiplexer, the multiplexer being configured to receive a selection control signal corresponding to the skew match amount for the respective transmission lane and to output serial data based on the selection control signal, the serial shift register being configured to receive a serial data signal.

19. The IC of claim 10, wherein the programmable shift logic comprises a multiplexer and a parallel shift register, different contiguous parallel bits of the parallel shift register corresponding to respective inputs of the multiplexer, the multiplexer being configured to receive a selection control signal corresponding to the skew match amount for the respective transmission lane and to output parallel data bits based on the selection control signal, the parallel shift register being configured to receive parallel data and to shift parallel data within the parallel shift register at a clock cycle.

20. The IC of claim 10, wherein the transmitter comprises phase alignment logic to phase align the signal received from a first clock domain input to a second clock domain.

* * * * *